United States Patent
Uchizono et al.

(10) Patent No.: US 8,488,860 B2
(45) Date of Patent: Jul. 16, 2013

(54) MAGNETIC RESONANCE IMAGING APPARATUS

(75) Inventors: Shinichi Uchizono, Nasushiobara (JP); Nobuyasu Ichinose, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 338 days.

(21) Appl. No.: 12/917,691

(22) Filed: Nov. 2, 2010

(65) Prior Publication Data

US 2011/0103668 A1    May 5, 2011

(30) Foreign Application Priority Data

Nov. 5, 2009 (JP) ................... 2009-254264
Sep. 28, 2010 (JP) ................... 2010-217656

(51) Int. Cl.
*G06K 9/00* (2006.01)
(52) U.S. Cl.
USPC ........................................ 382/131
(58) Field of Classification Search
None
See application file for complete search history.

(56) References Cited

U.S. PATENT DOCUMENTS

| 6,794,872 | B2 | 9/2004 | Meyer et al. | |
|---|---|---|---|---|
| 7,259,559 | B2 | 8/2007 | Nabetani et al. | |
| 2004/0116797 | A1 | 6/2004 | Takahashi et al. | |
| 2008/0231269 | A1* | 9/2008 | Ookawa | 324/307 |
| 2009/0001984 | A1* | 1/2009 | Hwang | 324/307 |
| 2010/0052676 | A1* | 3/2010 | Sugiura | 324/309 |

FOREIGN PATENT DOCUMENTS

| CN | 101268943 A | 9/2008 |
|---|---|---|
| CN | 101438182 A | 5/2009 |
| JP | 10-179551 | 7/1998 |
| JP | 2008-029834 | 2/2008 |

* cited by examiner

*Primary Examiner* — Bhavesh Mehta
*Assistant Examiner* — Siamak Harandi
(74) *Attorney, Agent, or Firm* — Nixon & Vanderhye PC

(57) ABSTRACT

MRI signal data is received individually by multiple element coils. For each channel assigned to each element coil at a positioning image taking time, the collected magnetic resonance signal data is entered into a storage unit. An image is reconstructed from the magnetic resonance signal data stored in the storage unit, by referring the storage unit regarding the channel selected at the positioning image taking time. The reconstructed image is displayed. When a channel selection change command is received, an image is reconstructed using the magnetic resonance signal data stored in the storage unit, by referring to the storage unit regarding the changed channel. The after-change corrected image is displayed.

20 Claims, 17 Drawing Sheets

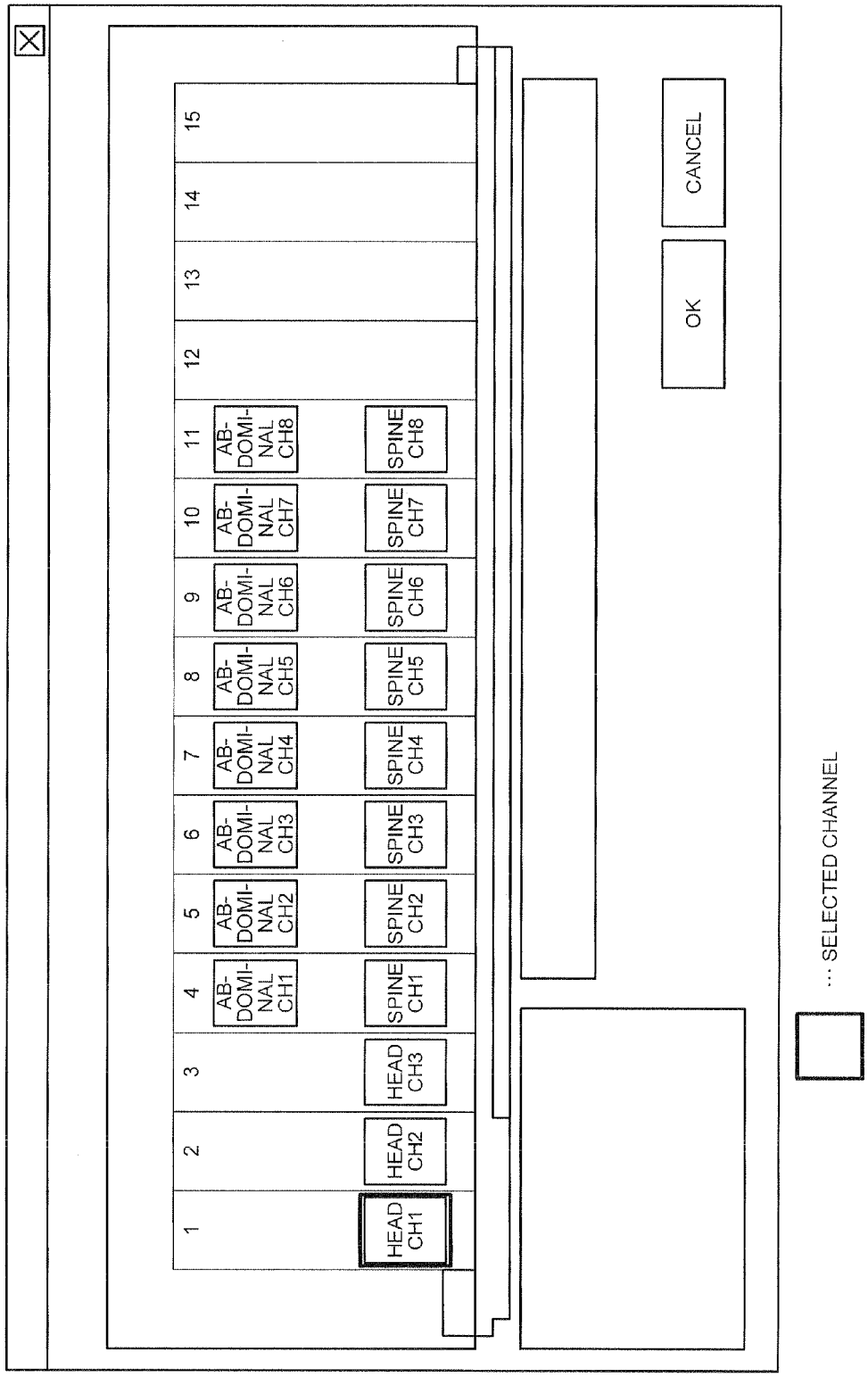

FIG.9
CH2
CH1
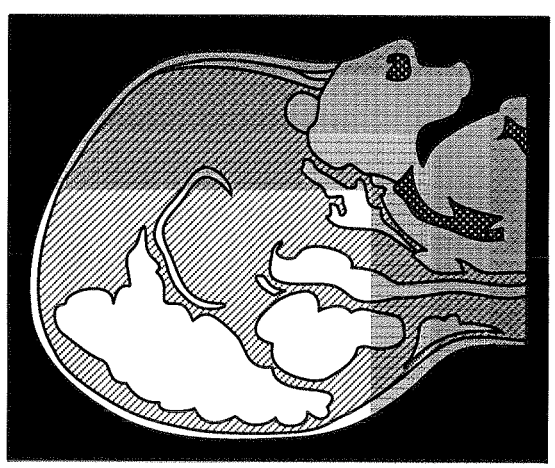

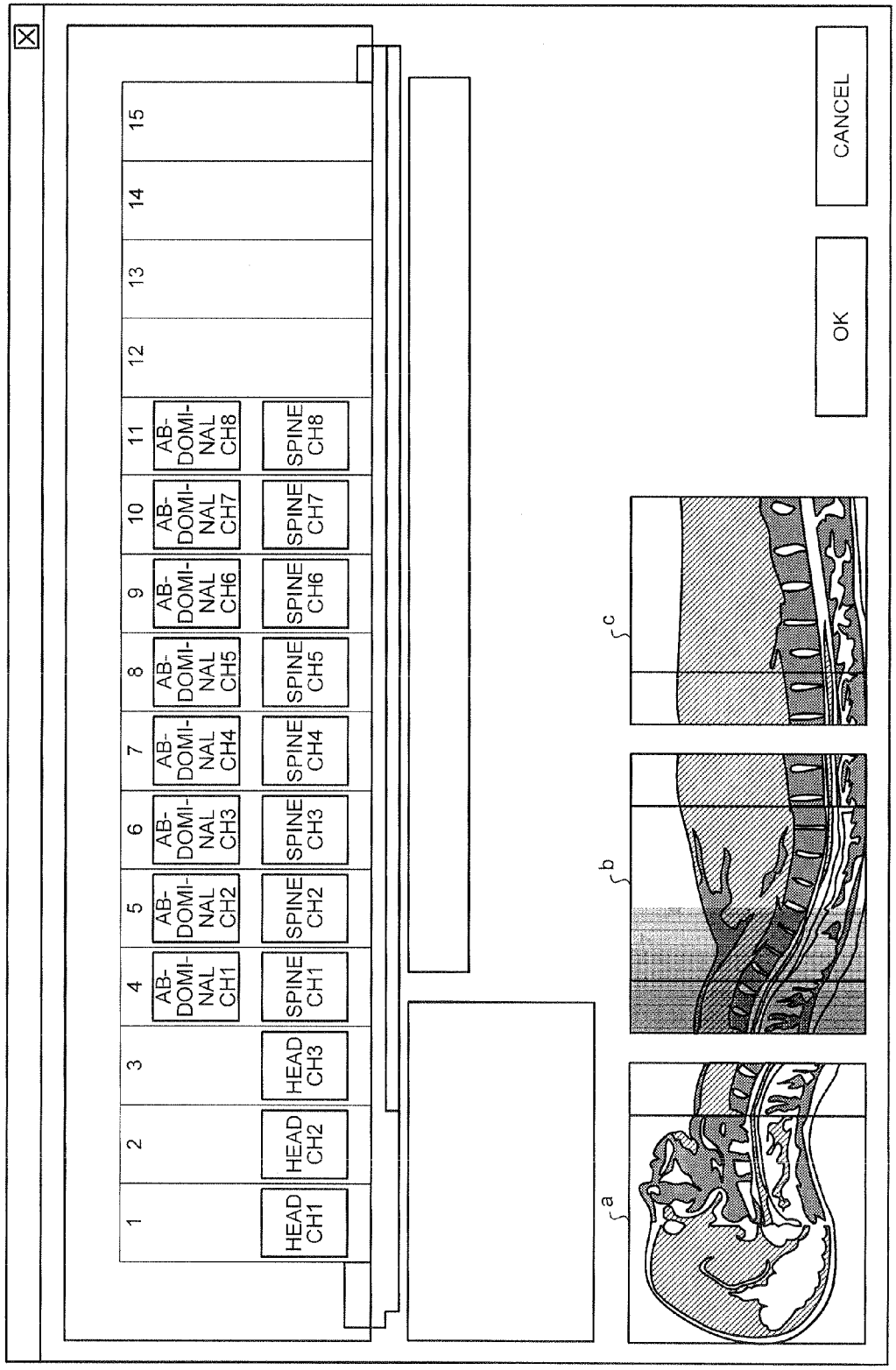

MAGNETIC RESONANCE IMAGING APPARATUS

CROSS-REFERENCE TO RELATED APPLICATIONS

This application is based upon and claims the benefit of priority from Japanese Patent Application No. 2009-254264, filed on Nov. 5, 2009; and Japanese Patent Application No. 2010-217656, filed on Sep. 28, 2010, the entire contents of all of which are incorporated herein by reference.

FIELD

Embodiments described herein relate generally to a magnetic resonance imaging apparatus.

BACKGROUND

Conventionally, the following procedure is followed when a magnetic resonance imaging apparatus (hereinafter, "MRI apparatus") performs imaging. First, a subject is positioned in the MRI apparatus in such a manner that an imaging target area is placed at the center of the magnetic field in which a magnetostatic field and a gradient magnetic field are superposed on each other. Next, a positioning image is taken in the MRI apparatus, and is displayed on the display unit of the MRI apparatus. Then, an operator such as a technician designates a region of interest (ROI) by use of the displayed positioning image. Thereafter, main imaging (hereinafter, "main scanning") is executed in the MRI apparatus, and a medical image is reconstructed in the MRI apparatus in accordance with the designated ROI.

Imaging on the MRI apparatus may adopt a multi-coil system (e.g., Japanese Patent Application Laid-open No. 10-179551, U.S. Pat. No. 6,794,872, and Japanese Patent Application Laid-open No. 2008-29834). The multi-coil system is a reception coil that includes multiple element coils to receive magnetic resonance signals radiated from the subject (hereinafter, "nuclear magnetic resonance (NMR) signals"). When the multi-coil system is used, NMR signals are collected in accordance with channels that are assigned to the element coils. For this reason, a technology with which an element coil for imaging is automatically selected to collect NMR signals on a channel the most suitable for imaging has been offered. For example, the MRI apparatus identifies an element coil overlapping the center of the magnetic field, and selects the identified element coil as an element coil for imaging.

It has been difficult, however, for an operator such as a technician to judge whether a channel is suitably selected in accordance with the above technology. For example, because the subject is not suitably positioned, the imaging target area may be shifted from the center of the magnetic field, or the selection of the element coil that overlaps the center of magnetic field may not always mean the selection of the most suitable channel for imaging. It is yet difficult to judge which channel should be selected based on the positioning image. For this reason, if the channel selection is in doubt, the operator has to, for example, retake a positioning image. Moreover, if main scanning is executed without noticing that an unsuitable channel is selected, the operator has to redo, for example, the main scanning.

BRIEF DESCRIPTION OF THE DRAWINGS

FIG. 8 is a diagram for explaining a screen after the channel selection is changed, according to the first embodiment;

FIG. 9 is a diagram for explaining correction to the positioning image data according to the first embodiment;

FIG. 19 is a diagram for explaining a channel selection screen according to the fourth embodiment.

DETAILED DESCRIPTION

Exemplary embodiments of the MRI apparatus are explained in detail below with reference to the attached drawings.

The MRI apparatus according to the present embodiments includes a collecting unit, a reconstructing unit, a display unit, a receiving unit, a correcting unit, and an after-change display unit. The collecting unit collects, at the positioning image taking time, magnetic resonance signal data received individually by multiple element coils in accordance with channels that are assigned to the element coils, and stores the collected magnetic resonance signal data in the storage unit in accordance with the channels. The reconstructing unit reconstructs an image from the magnetic resonance signal data stored in the storage unit, by referring to the storage unit in relation to the channel selected at the positioning image taking time. The display unit displays the image reconstructed by the reconstructing unit. The receiving unit receives channel selection change. When the receiving unit receives the change, the correcting unit corrects the image reconstructed by the reconstructing unit by use of the magnetic resonance signal data stored in the storage unit, by referring to the storage unit in relation to the changed channel. The after-change display unit displays information on the image corrected by the correcting unit.

Figure 1:
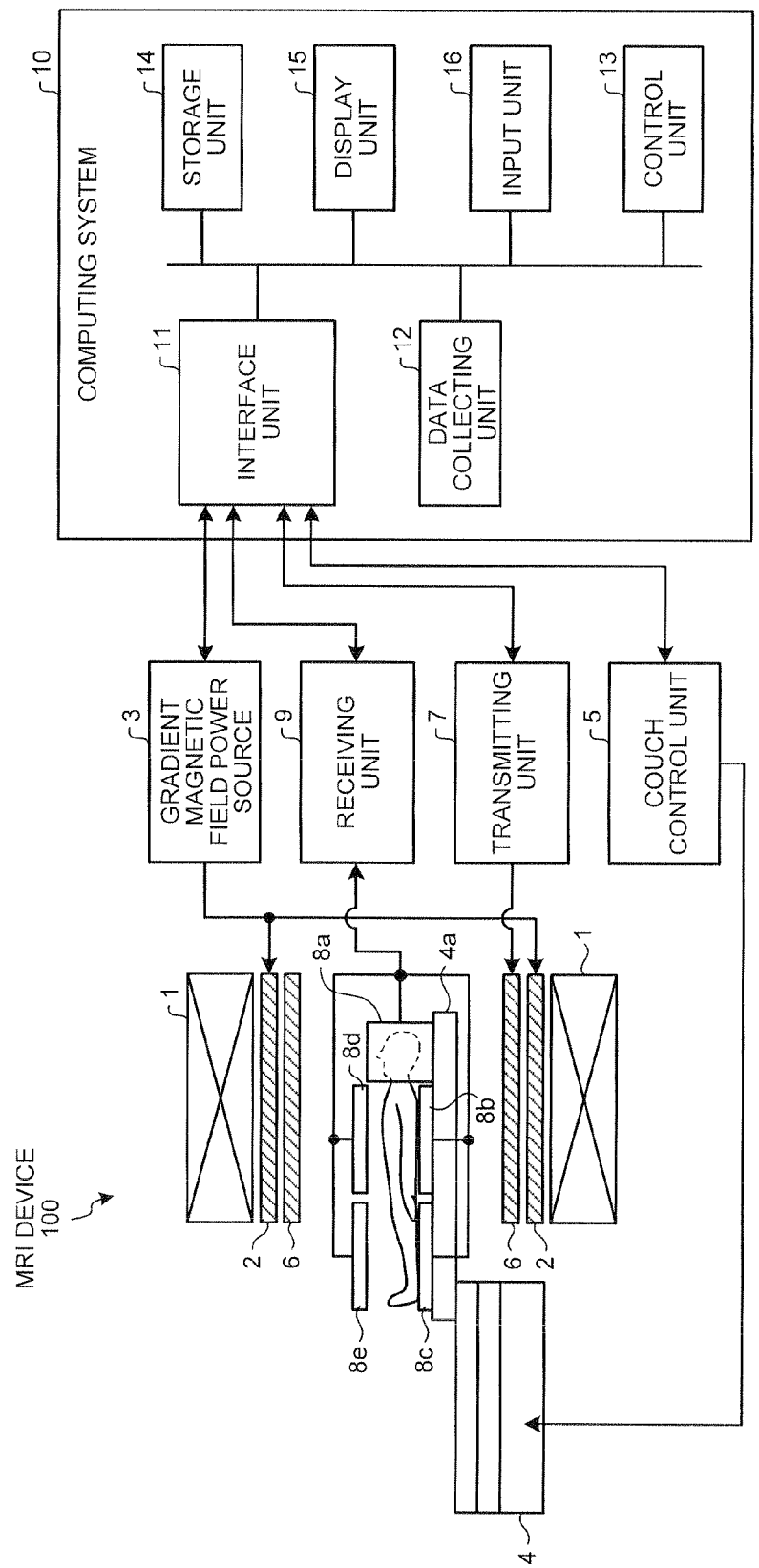
FIG. 1 is a block diagram for showing the structure of an MRI apparatus according to the first embodiment.

The MRI apparatus according to the first embodiment is now explained. First, the structure of the MRI apparatus according to the first embodiment is explained with reference to FIGS. 1 to 10. FIG. 1 is a block diagram for showing the structure of the MRI apparatus according to the first embodiment.

As illustrated in FIG. 1, an MRI apparatus 100 according to the first embodiment includes a magnetostatic field magnet 1, a gradient magnetic field coil 2, a gradient magnetic field power source 3, a couch 4, a couch control unit 5, a transmission coil 6, a transmitting unit 7, reception coils 8a to 8e, a receiving unit 9, and a computing system 10.

The magnetostatic field magnet 1 is shaped into a hollow cylinder and generates a magnetostatic field uniformly in the space inside. The magnetostatic field magnet 1 may be a permanent magnet or a superconductive magnet.

The gradient magnetic field coil 2 is shaped into a hollow cylinder and generates a gradient magnetic field in the space inside. More specifically, the gradient magnetic field coil 2 is arranged inside the magnetostatic field magnet 1, and generates a gradient magnetic field when a current is supplied from the gradient magnetic field power source 3. Furthermore, the gradient magnetic field coil 2 is formed by combining three coils provided in correspondence with the X, Y, and Z axes that run orthogonally to one another, and the three coils generate gradient magnetic fields that change their magnetic intensities along the X, Y, and Z axes when the current is supplied individually from the gradient magnetic field power source 3. The z axis runs in the same direction as the magnetostatic field.

The gradient magnetic fields generated along the X, Y, and Z axes by the gradient magnetic field coil 2 may correspond to a slice selection gradient magnetic field Gs, a phase encoding gradient magnetic field Ge, and a read-out gradient magnetic field Gr, respectively. The slice selection gradient magnetic field Gs is used to arbitrarily determine an imaging section. The phase encoding gradient magnetic field Ge is used to change the phase of the NMR signal in accordance with the spatial position. The read-out gradient magnetic field Gr is used to change the frequency of the NMR signal in accordance with the spatial position.

The gradient magnetic field power source 3 supplies a current to the gradient magnetic field coil 2 in accordance with pulse sequence execution data sent from the computing system 10.

The couch 4 includes a top board 4a on which a subject P lies, and the top board 4a is inserted into the hollow (imaging opening) of the gradient magnetic field coil 2 with the subject P lying thereon. In general, the couch 4 is placed in such a manner that its longitudinal direction runs in parallel with the central axis of the magnetostatic field magnet 1.

The couch control unit 5 drives the couch 4 to move the top board 4a in the longitudinal and vertical directions.

The transmission coil 6 generates a high-frequency magnetic field. More specifically, the transmission coil 6 is arranged inside the gradient magnetic field coil 2, and generates a high-frequency magnetic field when receiving a high-frequency pulse supplied by the transmitting unit 7.

The transmitting unit 7 transmits a high-frequency pulse corresponding to the Larmor frequency to the transmission coil 6, in accordance with the pulse sequence execution data supplied from the computing system 10.

The reception coils 8a to 8e receive NMR signals. More specifically, the reception coils 8a to 8e are arranged inside the gradient magnetic field coil 2, and receive the NMR signals emitted from the subject P under the influence of the high-frequency magnetic field. Furthermore, the reception coils 8a to 8e output the received NMR signals to the receiving unit 9.

Figure 2:
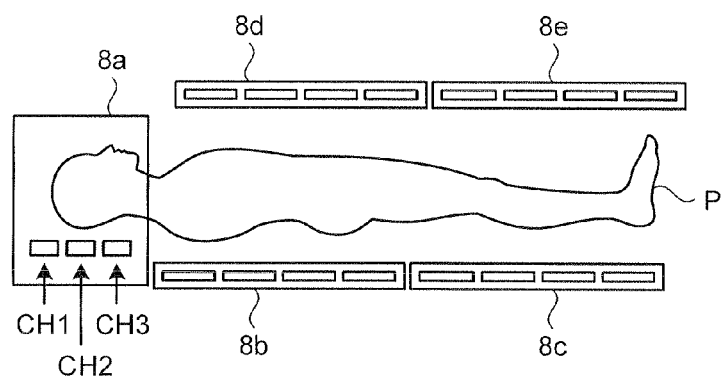
FIG. 2 is a diagram for explaining reception coils according to the first embodiment.

The reception coils 8a to 8e are now explained with reference to FIG. 2. FIG. 2 is a diagram for explaining the reception coils according to the first embodiment. In particular, as illustrated in FIG. 2, the reception coils 8b and 8c are spinal reception coils arranged between the back of the subject P and the top board 4a, and each has a multi-coil system that includes multiple element coils to receive NMR signals. In the example of FIG. 2, each of the reception coils 8b and 8c has four element coils. Furthermore, the reception coils 8d and 8e are abdominal reception coils placed on the abdominal side of the subject, and each of the coils has a multi-coil system that includes multiple element coils to receive NMR signals. In the example of FIG. 2, the reception coils 8d and 8e contain four element coils each.

Furthermore, the reception coil 8a is a head reception coil placed on the head of the subject P, and has a multi-coil system that contains element coils to receive NMR signals. In the example of FIG. 2, the reception coil 8a contains three element coils. Here, one element coil or more may be assigned to one channel. For convenience of explanation, it is assumed that one element coil is assigned to one channel according to the first embodiment. Thus, channels, "channel 1", "channel 2", and "channel 3", are assigned to the three element coils in the example of FIG. 2.

In FIG. 1, the receiving unit 9 generates NMR signal data based on the NMR signals output by the reception coils 8a to 8e, in accordance with the pulse sequence execution data supplied by the computing system 10. In particular, the receiving unit 9 generates the NMR signal data by performing digital conversion onto the NMR signals output by the reception coils 8a to 8e, and transmits the generated NMR signal data to the computing system 10.

The MRI apparatus 100 according to the first embodiment collects profile data, positioning image data, and sensitivity map data before executing the main scanning. For this reason, the receiving unit 9 generates the NMR signal data based on the NMR signals output by the reception coils 8a to 8e, at each of the steps of collecting the profile data, of collecting the positioning image data, of collecting the sensitivity map data, and of collecting the main scanning data. The receiving unit 9 stores therein the assignments of the element coils of the reception coils 8a to 8e and channels, and generates the NMR signal data for each channel.

The computing system 10 controls the entire MRI apparatus 100, collects the NMR signal data, and reconstructs images. The computing system 10 includes an interface unit 11, a data collecting unit 12, a control unit 13, a storage unit 14, a display unit 15, and an input unit 16.

The interface unit 11 is connected to the gradient magnetic field power source 3, the couch control unit 5, the transmitting unit 7, and the receiving unit 9, and controls input/output of data exchanged between the connected units and the computing system 10.

The data collecting unit 12 collects the NMR signal data transmitted by the receiving unit 9 for individual channels. After collecting the NMR signal data, the data collecting unit 12 stores the collected NMR signal data in the storage unit 14 for individual channels.

The storage unit 14 stores therein the NMR signal data collected by the data collecting unit 12 for individual channels. Moreover, the storage unit 14 stores image data generated by a later-described image reconstruction correcting unit 13e for each subject P. The storage unit 14 may be a semiconductor memory apparatus such as a random access memory (RAM), a read only memory (ROM), and a flash memory, or a hard disk or an optical disk. The storage unit 14 will be explained in detail later.

The display unit 15 displays images generated by the later-described image reconstruction correcting unit 13e, a screen for channel selection, and the like. The display unit 15 may be a display apparatus such as a liquid crystal display.

Figure 3:
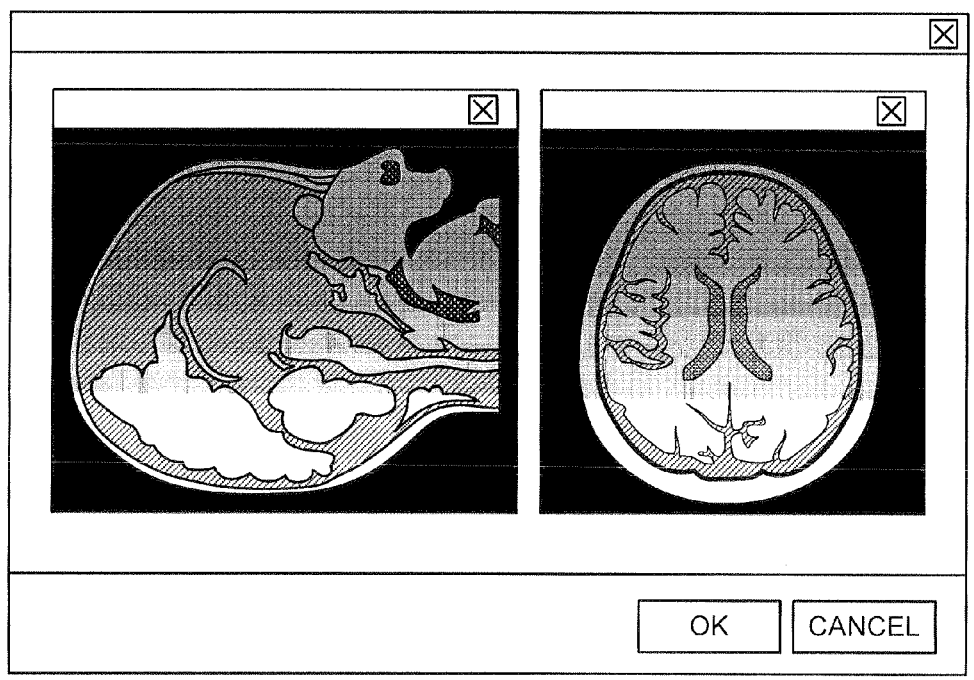
FIG. 3 is a diagram for explaining a positioning image displayed according to the first embodiment.

For example, the display unit 15 displays a positioning image, as illustrated in FIG. 3. FIG. 3 is a diagram for explaining a positioning image displayed according to the first embodiment. For example, the display unit 15 displays a sagittal image, which is the positioning image according to the first embodiment, in a window on the left, and an axial image, which is a main scanning image according to the first embodiment, in another window on the right. A sagittal image is a vertical section of the subject P viewed from the side. An axial image is a cross section of the subject P viewed from the body axis direction. The display unit 15 displays an "OK" button and a "cancel" button on the lower right corner of the window. As described later, the "OK" button and the "cancel" button are manipulated when channel selection is changed or accepted.

Figure 4:
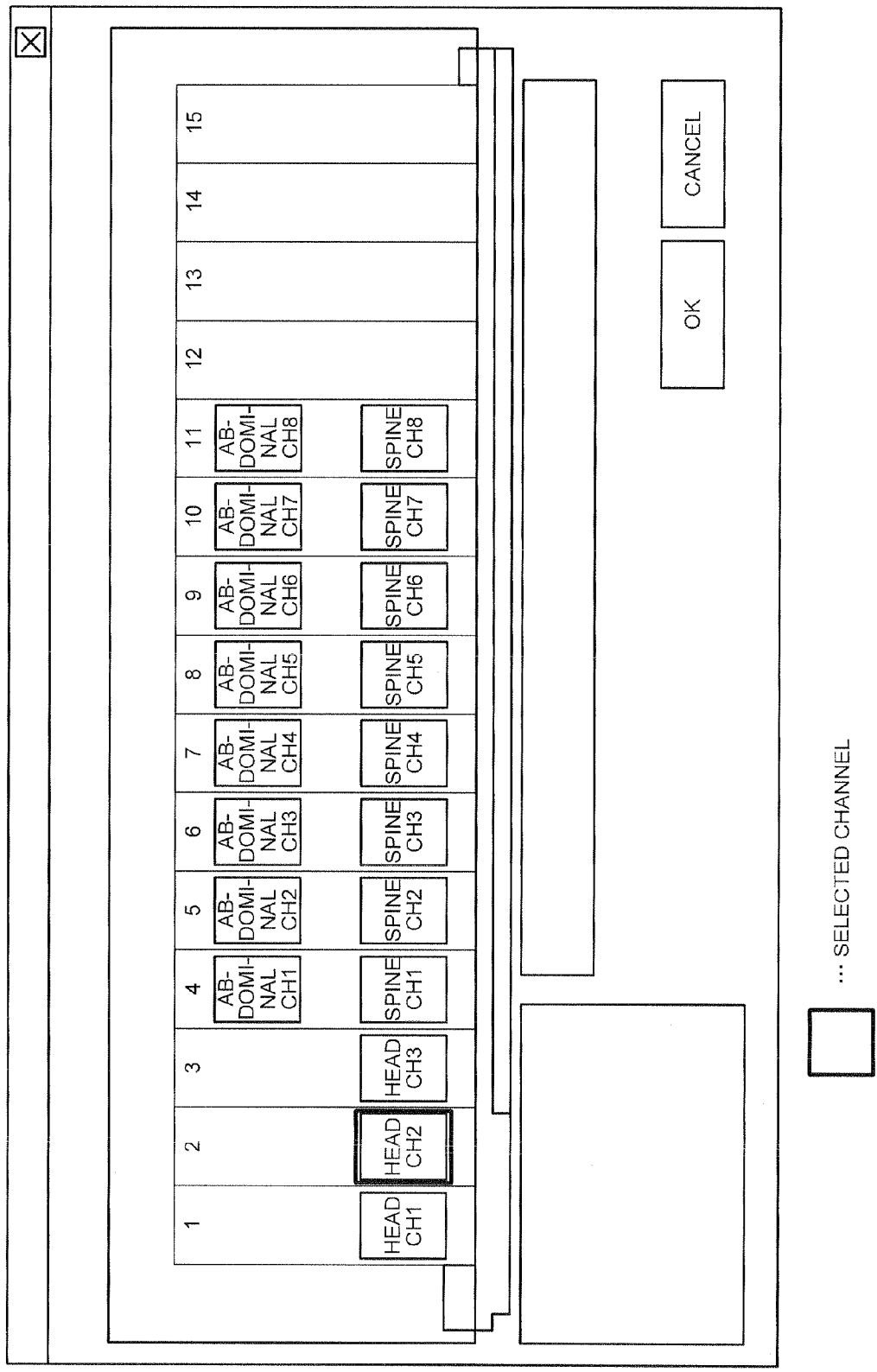
FIG. 4 is a diagram for explaining a channel selection screen according to the first embodiment.

In addition, the display unit 15 displays, for example, a channel selection screen, as illustrated in FIG. 4. FIG. 4 is a diagram for explaining the channel selection screen according to the first embodiment. For example, the display unit 15 displays channels assigned to the element coils of the reception coils 8a to 8e in accordance with the actual arrangement. For example, the reception coil 8a according to the first embodiment contains three element coils, and thus the display unit 15 displays three channels ("head channel 1", "head channel 2", and "head channel 3"), as illustrated in FIG. 4. The display unit 15 displays an "OK" button and a "cancel" button in the lower right corner. As described later, the "OK" button and the "cancel" button are manipulated when the channel selection is changed.

In FIG. 1, the input unit 16 receives various operations and information input by the operator. The input unit 16 may be a pointing apparatus such as a mouse and a trackball, a selecting apparatus such as a mode switch, or an input apparatus such as a keyboard.

The control unit 13 controls the above units and thereby performs control over the entire MRI apparatus 100. The control unit 13 may be an integrated circuit such as an application specific integrated circuit (ASIC) and a field programmable gate array (FPGA), or an electronic circuit such as a central processing unit (CPU) and a micro processing unit (MPU). The control unit 13 will be described in detail below.

Figure 5:
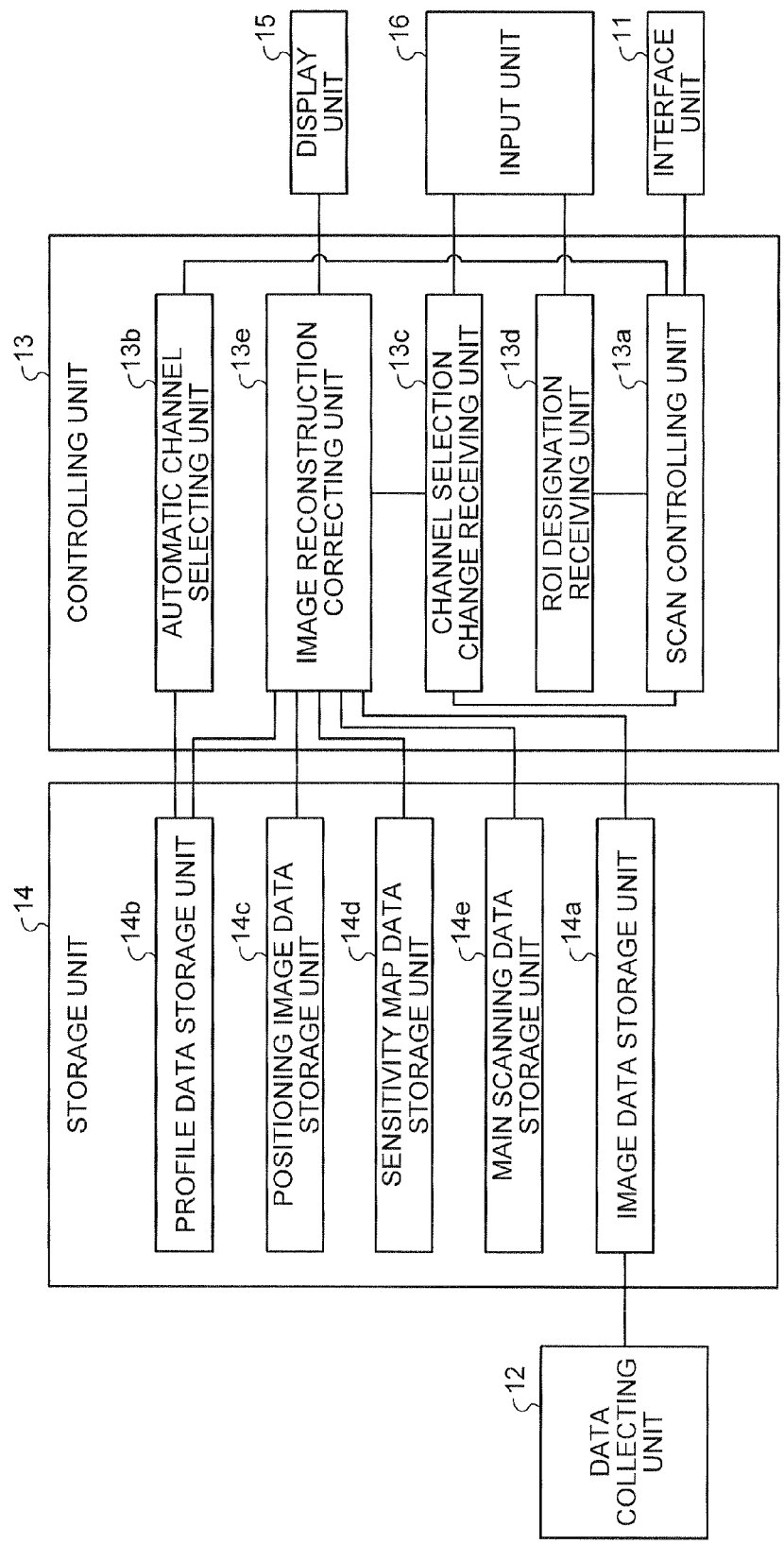
FIG. 5 is a functional block diagram for showing the detailed structure of a storage unit and a control unit according to the first embodiment.

Next, the structure of the storage unit 14 and the control unit 13 is explained in detail with reference to FIG. 5. FIG. 5 is a functional block diagram for showing the detailed structure of the storage unit and the control unit according to the first embodiment. As illustrated in FIG. 5, the storage unit 14 includes an image data storage unit 14a, a profile data storage unit 14b, a positioning image data storage unit 14c, a sensitivity map data storage unit 14d, and a main scanning data storage unit 14e.

The image data storage unit 14a is connected to the data collecting unit 12 and the image reconstruction correcting unit 13e, and stores therein the NMR signal data collected by the data collecting unit 12 for individual channels. Furthermore, the NMR signal data stored in the image data storage unit 14a is used in the process of the image reconstruction correcting unit 13e.

As discussed above, the MRI apparatus 100 according to the first embodiment separately collects the profile data, the positioning image data, and the sensitivity map data before executing the main scanning. For this reason, the data collecting unit 12 enters the NMR signal data into the image data storage unit 14a at every step of collecting the profile data, of collecting the positioning image data, of collecting the sensitivity map data, and of collecting the main scanning data, and the image data storage unit 14a stores therein the NMR signal data for each step.

The profile data storage unit 14b is connected to the image reconstruction correcting unit 13e and an automatic channel selecting unit 13b, and stores therein the profile data. More specifically, the profile data storage unit 14b stores therein the profile data generated by the image reconstruction correcting unit 13e for individual channels. Furthermore, the profile data stored in the profile data storage unit 14b is used in the process of the automatic channel selecting unit 13b.

Figure 6:
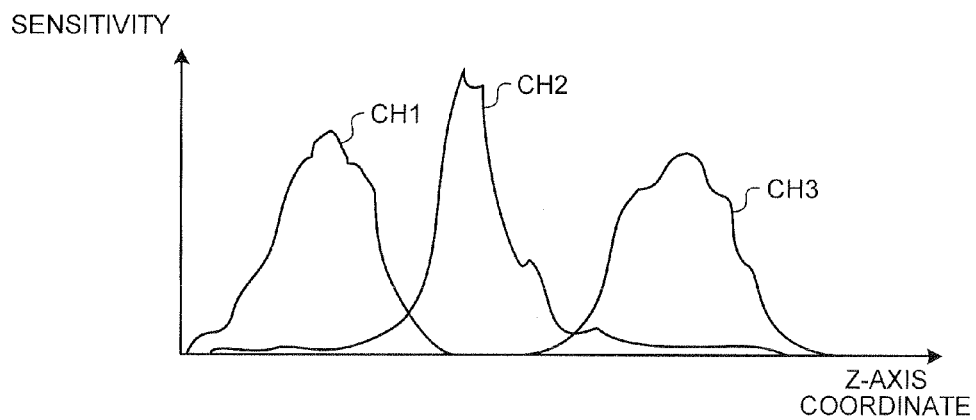
FIG. 6 is a diagram for explaining profile data according to the first embodiment.

The profile data indicates the sensitivity of each element coil and the sensitivity of the element coils in the arrangement direction of element coils. For example, a scan control unit 13a controls the units at the step of collecting the profile data in such a manner that a gradient magnetic field is applied in the arrangement direction of the element coils, or in other words the z-axis direction, and the data collecting unit 12 collects the NMR signal data equivalent to one encoding, for each channel. Then, the image reconstruction correcting unit 13e generates projection data from the NMR signal data, and enters it into the profile data storage unit 14b. FIG. 6 is a diagram for explaining the profile data according to the first embodiment. For example, when the "head channel 1", the "head channel 2", and the "head channel 3" are assigned to the element coils in the imaging range, the profile data indicates sensitivities of these channels as illustrated in FIG. 6. The profile data is generally used in determination of the positions of the element coils.

The positioning image data storage unit 14c is connected to the image reconstruction correcting unit 13e, and stores therein the positioning image data. In particular, the positioning image data storage unit 14c stores therein the positioning image data generated by the image reconstruction correcting unit 13e. Furthermore, the positioning image data stored in the positioning image data storage unit 14c is displayed by the display unit 15.

Figure 7A:
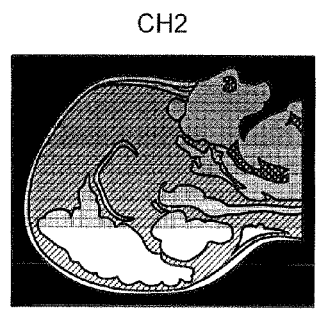
FIGS. 7A and 7B are diagrams for explaining positioning image data and sensitivity map data according to the first embodiment.
Figure 7B:
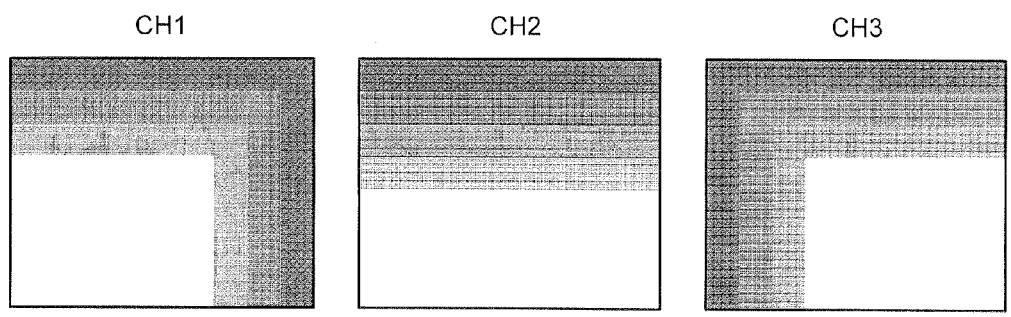

FIGS. 7A and 7B are diagrams for explaining the positioning image data and the sensitivity map data according to the first embodiment. An example of positioning image data is presented in FIG. 7A, and an example of sensitivity map data is presented in FIG. 7B. For example, when the automatic channel selecting unit 13b selects "head channel 2", the scan control unit 13a controls the units in such a manner than the element coil of "head channel 2" is employed at the step of collecting the positioning image data, and the data collecting unit 12 collects the NMR signal data. Then, the image reconstruction correcting unit 13e generates the positioning image data from the NMR signal data, and enters it in the positioning image data storage unit 14c. The positioning image data storage unit 14c stores therein the positioning image data as illustrated in FIG. 7A.

The sensitivity map data storage unit 14d is connected to the image reconstruction correcting unit 13e, and stores therein the sensitivity map data. In particular, the sensitivity map data storage unit 14d stores therein the sensitivity map data generated by the image reconstruction correcting unit 13e, for individual channels. Furthermore, the sensitivity map data stored in the sensitivity map data storage unit 14d is used in the process of the image reconstruction correcting unit 13e.

The sensitivity map data indicates the sensitivity of each element coil, and represents the sensitivity spatial distribution. For example, the scan control unit 13a controls the units in such a manner that images of a certain slice is taken by use of a full-body reception coil (not shown) and also by a target element coil that collects the sensitivity map data at the step of collecting the sensitivity map data, and the data collecting unit 12 collects, for example, NMR signal data for 32 encoding in accordance with individual channels. Then, the image reconstruction correcting unit 13e generates a reference image from the NMR signal data received by the reception coils, and also generates a measurement image from the NMR signal data received by the element coils. Then, the image reconstruction correcting unit 13e finds the ratio of the reference image and the measurement image for each pixel to generate sensitivity map data in accordance with individual channels, and enters it in the sensitivity map data storage unit 14d. For example, the sensitivity map data storage unit 14d stores therein the sensitivity map data illustrated in FIG. 7B.

The sensitivity map data illustrated in FIG. 7B represents, from left to right, the sensitivity map data of the element coil to which "head channel 1" is assigned, the sensitivity map data of the element coil to which "head channel 2" is assigned, and the sensitivity map data of the element coil to which "head channel 3" is assigned. The element coil to which "head channel 1" is assigned is located in top of head of the subject P as indicated in FIG. 2. Thus, when the sagittal image of the head is determined as an imaging range, as indicated in FIG. 7B, the brightness becomes high in top of head and on the lower side, and low on the side of the body and the upper side.

The element coil to which "head channel 2" is assigned is located on the center side of the head of the subject P, as illustrated in FIG. 2. Thus, when the sagittal image of the head is determined as an imaging range, as illustrated in FIG. 7B, the brightness is high on the lower side and low on the upper side. The element coil assigned to "head channel 3" is located on the side of the body of the subject P, as illustrated in FIG. 2. Thus, when the sagittal image of the head is determined as an imaging range, as illustrated in FIG. 7B, the brightness is high on the side of the body and the lower side, and low in top of head and on the upper side. In this manner, the characteristics of the sensitivity map data vary from element coil to element coil. The above characteristics of the sensitivity map data are presented merely as examples, and are varied in association with the arrangement of the element coils and the like.

The main scanning data storage unit 14e is connected to the image reconstruction correcting unit 13e, and stores therein the main scanning data. More specifically, the main scanning data storage unit 14e stores therein main scanning image data generated by the image reconstruction correcting unit 13e for each subject P. The main scanning image data stored in the main scanning data storage unit 14e is displayed on the display unit 15.

In FIG. 5, the control unit 13 includes a scan control unit 13a, an automatic channel selecting unit 13b, a channel selection change receiving unit 13c, an ROI designation receiving unit 13d, and an image reconstruction correcting unit 13e.

The scan control unit 13a is connected to the automatic channel selecting unit 13b, the channel selection change receiving unit 13c, and the ROI designation receiving unit 13d, and controls the scanning operation. In particular, the scan control unit 13a exchanges information between the gradient magnetic field power source 3, the couch control unit 5, the transmitting unit 7, the receiving unit 9, and the like by way of the interface unit 11, and controls the collection of the profile data, the positioning image data, the sensitivity map data, and the main scanning data, in accordance with the preset imaging conditions.

For example, when receiving channel identification information from the automatic channel selecting unit 13b, the scan control unit 13a controls the units at the step of collecting the positioning image data so that an element coil to which the channel identified by the identification information is assigned is adopted. In addition, when receiving the channel identification information from the channel selection change receiving unit 13c and designation of the ROI from the ROI designation receiving unit 13d, the scan control unit 13a controls the units at the step of collecting the main scanning data so that imaging is conducted in the designated ROI by use of the element coil to which the channel identified by the identification information is assigned.

The automatic channel selecting unit 13b is connected to the profile data storage unit 14b and the scan control unit 13a, and automatically selects a channel for imaging. In particular, the automatic channel selecting unit 13b identifies the channel that overlaps the center of magnetic field based on the profile data stored for each channel by referring to the profile data storage unit 14b, and selects the identified channel as the imaging channel. In other words, because the MRI apparatus 100 has the positional information of the center of magnetic field, the automatic channel selecting unit 13b selects, for example, a channel exhibiting the highest sensitivity of the profile data in the center of magnetic field. For example, the automatic channel selecting unit 13b selects "head channel 2". As described above, because an element coil is assigned to each channel, selecting a channel at the automatic channel selecting unit 13b means selecting an imaging element coil. Then, the automatic channel selecting unit 13b sends the identification information of the selected channel to the scan control unit 13a.

The channel selection change receiving unit 13c is connected to the input unit 16, the image reconstruction correcting unit 13e, and the scan control unit 13a, and receives a channel selection change instructed by the operator. For example, if the "cancel" button is pressed on the screen illustrated in FIG. 3, the display is changed to the channel selection screen illustrated in FIG. 4. It is assumed here that "head channel 2" of the reception coil 8a is selected by the automatic channel selecting unit 13b in FIG. 4. Then, the operator clicks the icon indicating a channel that should be selected so that the channel selection can be changed. As a result, in place of the selected "head channel 2", "head channel 1" is newly selected, as illustrated in FIG. 8. FIG. 8 is a diagram for explaining a screen after the channel selection is changed according to the first embodiment. Then, the channel selection change receiving unit 13c transmits to the image reconstruction correcting unit 13e the channel identification information received by way of the input unit 16.

The channel selection change receiving unit 13c also receives channel acceptance from the operator. For example, when the "OK" button is pressed on the screen illustrated in FIG. 8, the display returns to the screen illustrated in FIG. 3, and the "OK" button is pressed again on the screen of FIG. 3, the channel selection change receiving unit 13c sends the identification information of the currently selected channel to the scan control unit 13a.

The ROI designation receiving unit 13d is connected to the input unit 16 and the scan control unit 13a, and receives the ROI designation from the operator. For example, a sagittal image, which is a positioning image according to the first embodiment, is displayed on the left window, as illustrated in FIG. 3. Then, the operator may designate the ROT on the sagittal image by use of the input unit 16 such as the mouse by dragging. In response, the ROI designation receiving unit 13d sends the ROI information received by way of the input unit 16 to the scan control unit 13a. According to the first embodiment, no axial image is displayed in the right window before the main scanning is executed. In response to the designation of the ROI, the scan control unit 13a executes the main scanning, and the image reconstruction correcting unit 13e reconstructs the main scanning image data. It is only then that an axial image is displayed in the right window.

The image reconstruction correcting unit 13e is connected to the profile data storage unit 14b, the positioning image data storage unit 14c, the sensitivity map data storage unit 14d, the main scanning data storage unit 14e, and the image data storage unit 14a.

At the step of collecting the profile data, the image reconstruction correcting unit 13e generates the profile data from the NMR signal data stored in the image data storage unit 14a in accordance with individual channels by referring to the image data storage unit 14a. Then, the image reconstruction correcting unit 13e enters the profile data generated for individual channels into the profile data storage unit 14b.

In addition, at the step of collecting positioning image data, the image reconstruction correcting unit 13e generates the positioning image data from the NMR signal data of a specific channel stored in the image data storage unit 14a, by referring to the image data storage unit 14a. For example, the image reconstruction correcting unit 13e generates the positioning image data from the NMR signal data that was collected by use of "head channel 2". Thereafter, the image reconstruction correcting unit 13e enters the generated positioning image data into the positioning image data storage unit 14c.

Still further, at the step of collecting the sensitivity map data, the image reconstruction correcting unit 13e generates the sensitivity map data from the NMR signal data stored for individual channels in the image data storage unit 14a by referring to the image data storage unit 14a. Thereafter, the image reconstruction correcting unit 13e enters the generated sensitivity map data for individual channels into the sensitivity map data storage unit 14d.

Moreover, when receiving the channel identification information from the channel selection change receiving unit 13c, the image reconstruction correcting unit 13e reads out the sensitivity map data of the channel identified by the identification information, by referring to the sensitivity map data storage unit 14d. Further, the image reconstruction correcting unit 13e reads out the positioning image data by referring to the positioning image data storage unit 14c. Then, the image reconstruction correcting unit 13e corrects the read-out positioning image data by use of the read-out sensitivity map data, and displays the corrected positioning image data on the display unit 15.

For example, as illustrated in FIG. 8, the channel selection change receiving unit 13c receives a change to the channel selection that "head channel 1" is to be selected. Then, the image reconstruction correcting unit 13e reads out the sensitivity map data of "head channel 1", by referring to the sensitivity map data storage unit 14d. Further, the image reconstruction correcting unit 13e reads out the positioning image data collected by the element coil of "head channel 2", by referring to the positioning image data storage unit 14c. Thereafter, as illustrated in FIG. 9, the image reconstruction correcting unit 13e corrects the brightness of the read-out positioning image data by use of the read-out sensitivity map data. FIG. 9 is a diagram for explaining the positioning image data correction according to the first embodiment.

Figure 10:
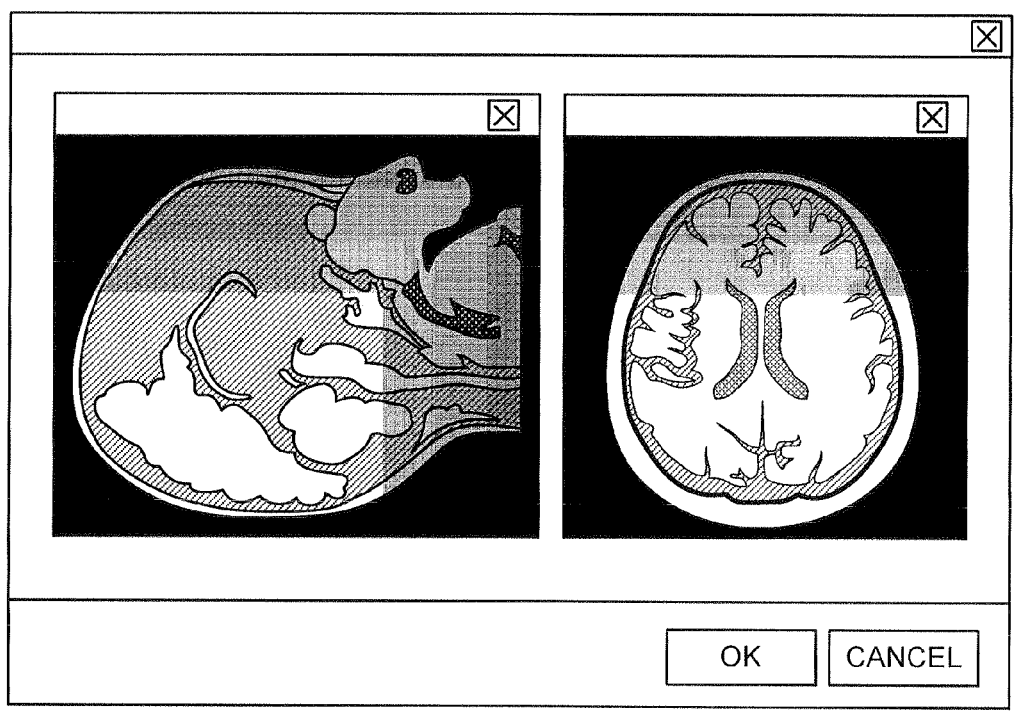
FIG. 10 is a diagram for explaining a positioning image displayed after the channel selection is changed according to the first embodiment.

In other words, because the read-out positioning image data is generated from the NMR signal data collected by use of the element coil of "head channel 2", the brightness becomes lower in the upward direction of the image and higher in the downward direction of the image, as illustrated in FIG. 7B. On the other hand, the corrected positioning image data is based on the sensitivity map data of "head channel 1". Here, the brightness of the sensitivity map data of "head channel 1" becomes lower in the upper right direction and higher in the lower left direction, as illustrated in FIG. 7B. For this reason, in the corrected positioning image data, the brightness is lower in the upper right direction and higher in the lower left direction, as illustrated in FIG. 9. In this manner, the image reconstruction correcting unit 13e outputs a sagittal image as illustrated on the left side of FIG. 10, to the display unit 15. FIG. 10 is a diagram for explaining the display of the positioning image after the channel selection is changed according to the first embodiment.

The channel that the image reconstruction correcting unit 13e receives from the channel selection change receiving unit 13c is not automatically selected by the automatic channel selecting unit 13b, but is selected by the operator. Thus, the image reconstruction correcting unit 13e corrects the positioning image data by use of the sensitivity map data and outputs it to the display unit 15. In this manner, the operator is provided with information for making a determination such as what difference would appear on the image when the channel selection is changed.

For example, if the affected area is located near the center of the head of the subject P, selection of "head channel 1" may be preferable to "head channel 2", as illustrated in FIG. 9 (see the main scanning data (axial image) on the right side of FIG. 3 and the main scanning data (axial image) on the right side of FIG. 10). The operator designates the ROI on the positioning image. If the operator sees the positioning image output onto the display unit 15 to find that the brightness of the ROI that is to be designated is low, the operator would presume that the brightness would also be low in the main scanning data. For this reason, the operator would change the channel selection to increase the brightness of the area of the positioning image that corresponds to the ROI so that the brightness of the main scanning data can be improved. In such a case, the MRI apparatus 100 according to the first embodiment provides the operator with information for making a determination.

At the step of collecting the main scanning data, the image reconstruction correcting unit 13e reconstructs image data from the NMR signal data of a specific channel stored in the image data storage unit 14a, by referring to the image data storage unit 14a. Thereafter, the image reconstruction correcting unit 13e enters the reconstructed image data into the main scanning data storage unit 14e.

Figure 11:
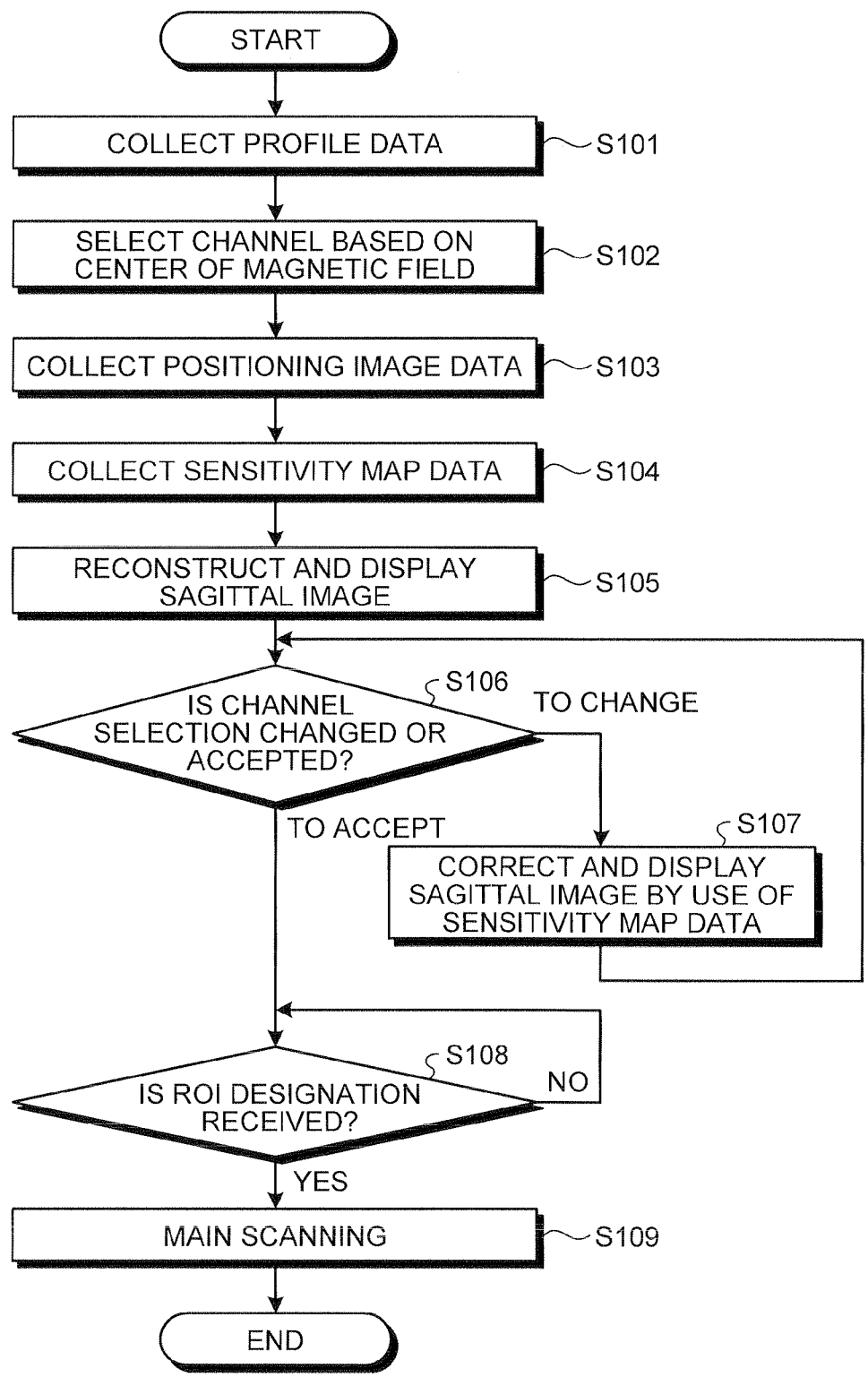
FIG. 11 is a flowchart of the processing procedure of the MRI apparatus according to the first embodiment.

Next, the procedure of the process performed by the MRI apparatus according to the first embodiment is explained with reference to FIG. 11. FIG. 11 is a flowchart for showing the procedure of the process performed by the MRI apparatus according to the first embodiment.

First, the profile data is collected under the control of the scan control unit 13a, as illustrated in FIG. 11 (step S101). In particular, the image reconstruction correcting unit 13e generates the profile data, the generated profile data is stored in the profile data storage unit 14b.

Next, the automatic channel selecting unit 13b selects a channel based on the center of magnetic field (step S102). More specifically, the automatic channel selecting unit 13b selects, for example, a channel with the highest sensitivity of the profile data in the center of magnetic field, by referring to the profile data storage unit 14b. For example, "head channel 2" of the reception coil 8a is selected.

Then, under control of the scan control unit 13a, the positioning image data is collected (step S103), and thereafter, the sensitivity map data is collected (step S104). Next, the image reconstruction correcting unit 13e reconstitutes the positioning image data by referring to the positioning image data storage unit 14c, and displays it on the display unit 15 (step S105). For example, a sagittal image is displayed as illustrated in the left window of FIG. 3.

Here, the MRI apparatus 100 waits for reception of channel selection change or channel acceptance at the channel selection change receiving unit 13c and makes a judgment thereon (step S106).

When the channel selection change receiving unit 13c receives channel selection change, the image reconstruction correcting unit 13e corrects the sagittal image by use of the sensitivity map data that corresponds to the changed channel, and displays it on the display unit 15 (step S107). In other words, when receiving the channel identification information from the channel selection change receiving unit 13c, the image reconstruction correcting unit 13e reads the sensitivity map data of the channel identified by the identification information, by referring to the sensitivity map data storage unit 14d. Moreover, the image reconstruction correcting unit 13e reads the positioning image data from the positioning image data storage unit 14c, and corrects the brightness of the read-out positioning image data by use of the read-out sensitivity map data, and displays the data on the display unit 15. For example, when channel selection change indicating that "head channel 1" of the reception coil 8a should be selected is received, the sagittal image is displayed as illustrated in the left window of FIG. 10.

Then, the MRI apparatus 100 waits again for reception of channel selection change or of channel acceptance (step S106), and, when receiving channel acceptance, the process proceeds to ROI designation by the ROI designation receiving unit 13d (step S108).

When the ROI designation receiving unit 13d receives the ROI designation (yes at step S108), the process proceeds to the main scanning by the scan control unit 13a (step S109). The image reconstruction correcting unit 13e reconstructs the image data from the NMR signal data collected through the main scanning, and displays it on the display unit 15. In other words, when receiving the ROI designation from the ROI designation receiving unit 13d, the image reconstruction correcting unit 13e reconstructs the image data in accordance with the ROI by referring to the image data storage unit 14a, and displays it on the display unit 15. For example, an axial image is displayed as illustrated in the right window of FIG. 10.

The MRI apparatus 100 according to the first embodiment executes the process by following the above process procedure, but the embodiment is not limited thereto. For example, the collection of the positioning image data (step S103) and the collection of the sensitivity map data (step S104) may be executed in the opposite order. In addition, the MRI apparatus 100 according to the first embodiment separately performs the collection of the profile data, of the positioning image data, and of the sensitivity map data, but the embodiment is not limited thereto. For example, if profile data can be created from the collected sensitivity map data, or if any data can be created from other data that has been collected, the method of suitably creating necessary data may be adopted. In such a case, the above process procedure should be changed in accordance with the method.

As mentioned above, in the MRI apparatus 100 according to the first embodiment, at the imaging time of a positioning image, the data collecting unit 12 collects the NMR signal data received by the element coils for a channel assigned to each of the element coils, under the control of the scan control unit 13a. Then, the data collecting unit 12 enters the collected NMR signal data in accordance with the individual channels in the storage unit 14. In addition, the image reconstruction correcting unit 13e refers to the storage unit 14 regarding the channel selected at the imaging time of the positioning image, and reconstructs the positioning image from the NMR signal data stored in the storage unit 14. Then, the display unit 15 displays the reconstructed positioning image. The channel selection change receiving unit 13c receives channel selection change. When the channel selection change receiving unit 13c receives the change, the image reconstruction correcting unit 13e refers to the storage unit 14 regarding the changed channel, and corrects the positioning image by use of the NMR signal data stored in the storage unit 14. Further, the display unit 15 displays information about the corrected positioning image.

According to the first embodiment, because the display unit 15 offers information as to how images would be changed when the channel selection is changed, the operator can suitably determine which channel should be selected, based on this information. Furthermore, because the information displayed on the display unit 15 is generated by use of the NMR signal data collected at the first imaging time of the positioning image, the positioning image taking operation does not have to be redone. As a result, the imaging time can be shortened, which can reduce the load on the patient.

The second embodiment is explained now. When changing the channel selection, a positioning image is corrected by use of the sensitivity map data according to the first embodiment, but the embodiment is not limited thereto. The positioning image may be reconstructed at the time of changing the channel selection. In the explanation of the second embodiment, the method of reconstituting the positioning image is dealt with.

Figure 12:
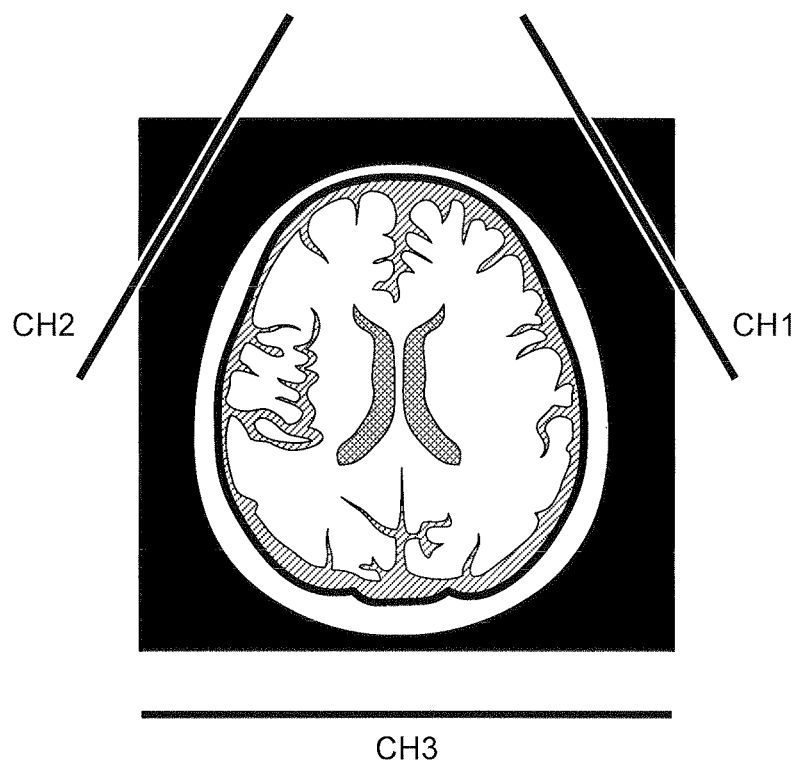
FIG. 12 is a diagram for explaining head reception coils according to the second embodiment.

According to the second embodiment, the reception coil 8a is a head reception coil mounted on the head of the subject P in the same manner as the first embodiment, and has a multi-coil system having multiple element coils to receive NMR signals. According to the second embodiment, the head of the subject P and the channels of the reception coil 8a may form a relationship as illustrated in FIG. 12. In addition, it is assumed here that the positioning image according to the second embodiment is an axial image as illustrated in FIG. 12. FIG. 12 is a diagram for explaining the head reception coil according to the second embodiment.

Further, at the step of collecting positioning image data, the scan control unit 13a according to the second embodiment controls the units to collect not only the positioning image data by use of the element coil to which the channel selected by the automatic channel selecting unit 13b is assigned, but also the positioning image data for all the element coils. For this reason, at the step of collecting the positioning image data, the image reconstruction correcting unit 13e generates the positioning image data for each channel from the NMR signal data of all the channels stored in the image data storage unit 14a, by referring to the image data storage unit 14a. Moreover, the positioning image data storage unit 14c stores therein the positioning image data for all the channels.

With such a structure, the automatic channel selecting unit 13b selects, for example, "head channel 3" of the reception coil 8a. Then, the operator presses icons on the channel selection screen so that "head channel 1" and "head channel 2" will be selected in addition to the already selected "head channel 3". In response, the channel selection change receiving unit 13c transmits the identification information of the channels received by way of the input unit 16 to the image reconstruction correcting unit 13e.

On the other hand, when receiving the channel identification information from the channel selection change receiving unit 13c, the image reconstruction correcting unit 13e reads out the positioning image data, by referring to the positioning image data storage unit 14c. For example, when receiving the identification information that identifies "head channel 1", "head channel 2", and "head channel 3" from the channel selection change receiving unit 13c, the image reconstruction correcting unit 13e reads out the positioning image data for each of "head channel 1", "head channel 2", and "head channel 3" from the positioning image data storage unit 14c. Then, the image reconstruction correcting unit 13e reconstructs a composite image (sum of squares) from the read-out positioning image data, and displays the reconstructed composite image on the display unit 15.

Figure 13:
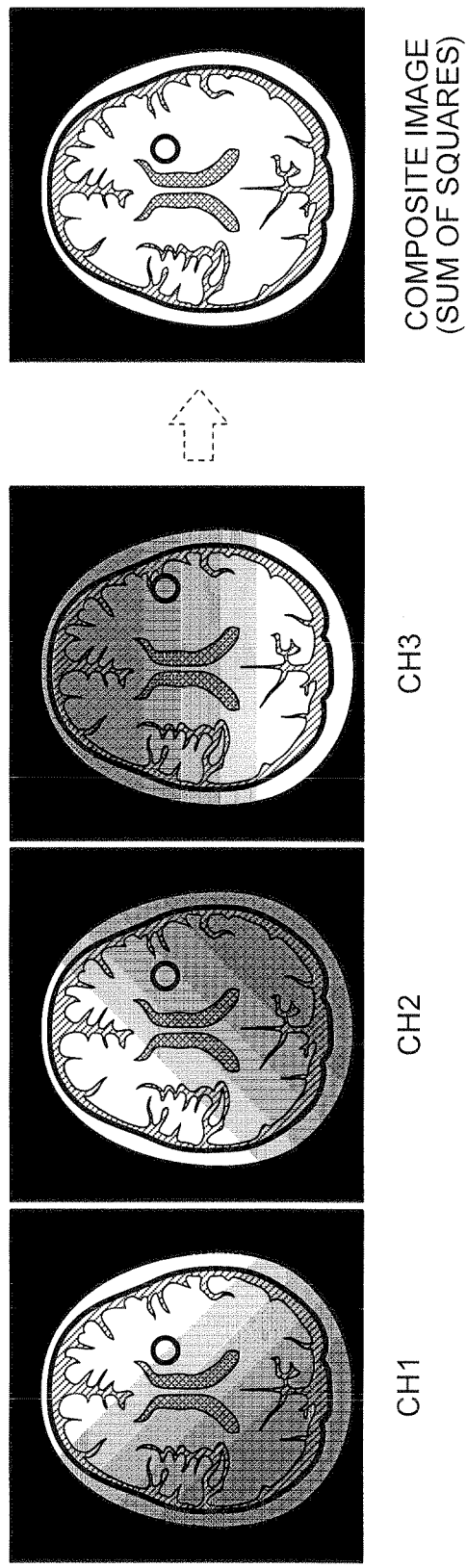
FIG. 13 is a diagram for explaining a reconstituted image according to the second embodiment.

FIG. 13 is a diagram for explaining an image reconstructed according to the second embodiment. It is considered that the brightness of the entire image is improved in the reconstructed image so that a clear image can be obtained as illustrated in FIG. 13. In other words, when all of "head channel 1", "head channel 2", and "head channel 3" are selected, an image signal S of a certain point of the composite image can be calculated by an expression $S=S1*S1+S2*S2+S3*S3$, where S1 represents an image signal of the point for "head channel 1", S2 represents an image signal of the point for "head channel 2", and S3 represents an image signal of the point for "head channel 3" ("*" indicates a multiplication, and S may be the root of the right side of the expression). In this manner, the brightness around the affected area indicated by a bold circle is intensified, and medical image quality is improved.

According to the second embodiment, when the channel selection is changed, for example, from "head channel 3" to "head channel 1", the image reconstruction correcting unit 13e reads, after receiving the identification information identifying "head channel 1" from the channel selection change receiving unit 13c, the positioning image data of "head channel 1" from the positioning image data storage unit 14c. Then, the image reconstruction correcting unit 13e simply displays the read-out positioning image data on the display unit 15.

As described above, in the MRI apparatus 100 according to the second embodiment, the data collecting unit 12 collects the NMR signal data received by each of the element coils in accordance with each channel assigned to each of the element coils, under control of the scan control unit 13a at the imaging time of the positioning image. Then, the data collecting unit 12 enters the collected NMR signal data for each channel into the storage unit 14. Furthermore, the image reconstruction correcting unit 13e reconstructs the positioning image from the NMR signal data stored in the storage unit 14 by referring to the storage unit 14 regarding the channel selected at the imaging time of the positioning image. In addition, the display unit 15 displays the reconstructed positioning image. Then, the channel selection change receiving unit 13c receives channel selection change. When the channel selection change receiving unit 13c receives the change, the image reconstruction correcting unit 13e refers to the storage unit 14 regarding the changed channel, and reconstructs the positioning image from the NMR signal data stored in the storage unit 14. Thereafter, the display unit 15 displays information regarding the reconstructed positioning image.

According to the second embodiment, information indicating how the image would be changed when the channel selection is changed is displayed on the display unit 15 in the same manner as the first embodiment, and thus the operator can determine, based on this information, which channel to be selected. In addition, the information displayed on the display unit 15 is generated by use of the NMR signal data collected at the first imaging time of the positioning image, and therefore the positioning image does not have to be retaken. As a result, the imaging time can be shortened, and the load on the patient can be reduced.

Now, the third embodiment is explained. When receiving change of channel selection from the operator, the positioning image after the change is made is displayed on the display unit 15 so that decision making information as to how the image would be changed after the channel selection is changed can be offered to the operator according to the first and second embodiments. However, the embodiment is not limited thereto. For example, when further receiving change of FOV designation from the operator, the image after the change may be displayed on the display unit 15 so that decision making information as to how the image would be changed after the FOV is changed can be offered to the operator.

Figure 14:
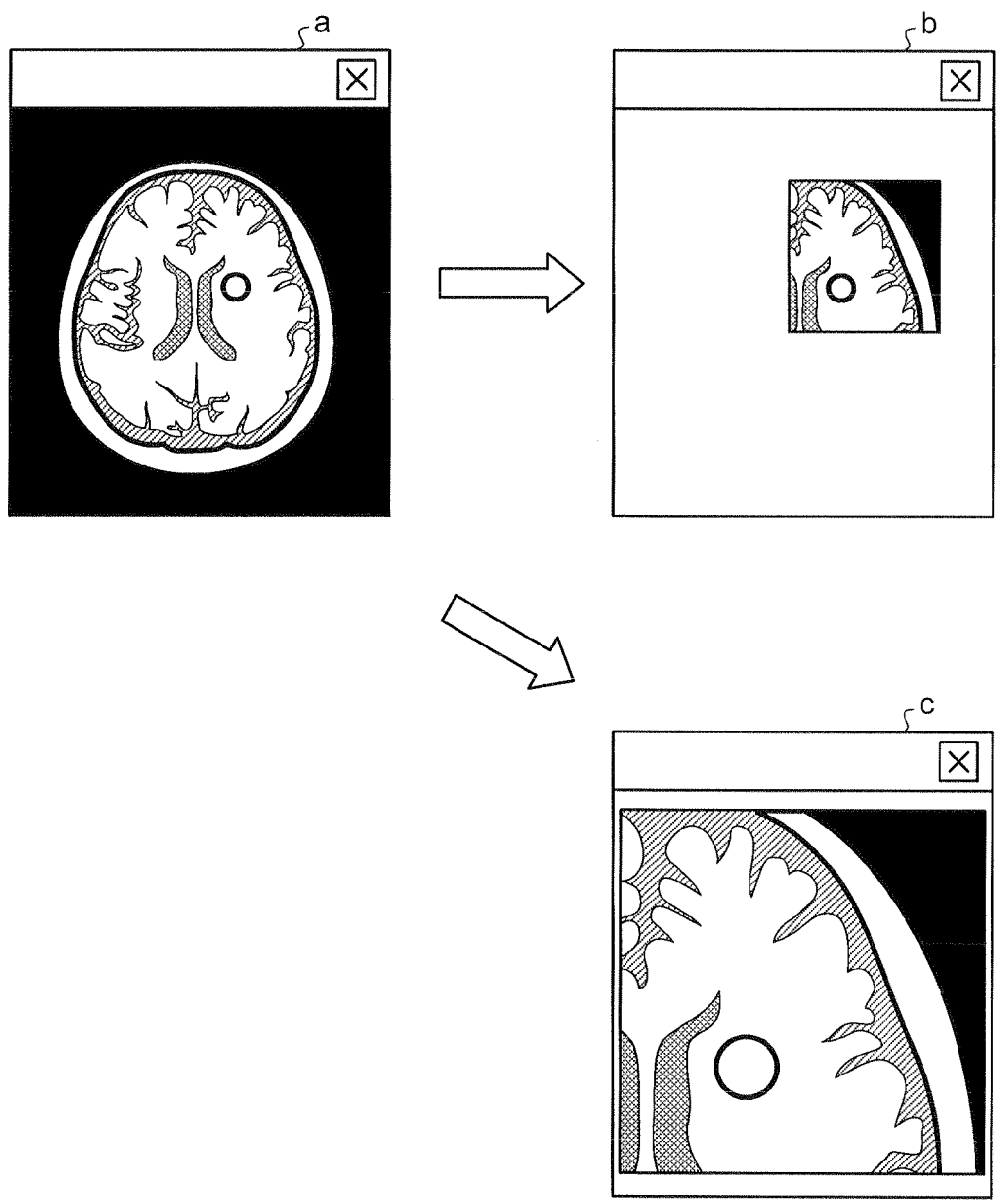
FIG. 14 is a diagram for explaining change of the designated field of view (FOV) according to the third embodiment.

For example, it is assumed that the MRI apparatus 100 receives an instruction for changing the FOV designation from "50×50" to "20×20" from the operator. Then, the image reconstruction correcting unit 13e reads out the positioning image data by referring to the positioning image data storage unit 14c, corrects or reconstructs the image in accordance with the "20×20" FOV designation, and displays it on the display unit 15. For example, the image reconstruction correcting unit 13e displays an axial image indicated with letter b in place of an axial image indicated with letter a, as illustrated in FIG. 14. Alternatively, the image reconstruction correcting unit 13e may perform an enlarging process on an image that is cut out in accordance with the "20×20" FOV designation, and display the resultant image, as indicated with letter c. FIG. 14 is a diagram for explaining the FOV designation change according to the third embodiment.

Moreover, when, for example, an aliasing artifact appears due to the FOV designation change, the image or an alert message may be displayed.

Aliasing artifacts are briefly explained below. In the field of MRI, a high-speed imaging technique called parallel imaging has been known. In parallel imaging, by adopting a multi-coil system and also by skipping phase encoding, the number of phase encodings required for image reconstruction can be reduced to an inverse of the number of element coils. For example, when the head coil includes three element coils, each element coil needs to collect the NMR signal ⅓ of the number of phase encoding. Hence, the imaging time can be shortened, and the imaging speed can be enhanced.

In an image reconstructed from NMR signals collected from the element coils, aliasing tends to appear on its edges. For this reason, in parallel imaging, an expanding process is performed to expand each of the images obtained in correspondence with the element coils based on different sensitivities of the element coils, and the images subjected to the expanding process are combined into an alias-free image.

However, an aliasing artifact occurs unless the actual area of the subject fits into the FOV designated as an imaging condition. For example, at double speed, aliasing occurs in two portions at most, and thus an alias-free image can be obtained by performing the expanding process in consideration of the two overlapping portions. If, however, the actual area of the subject does not fit in the designated FOV, overlapping may occur in three portions, and thus aliasing cannot be avoided even if the expanding process is performed in consideration of two overlapping portions.

Figure 15:
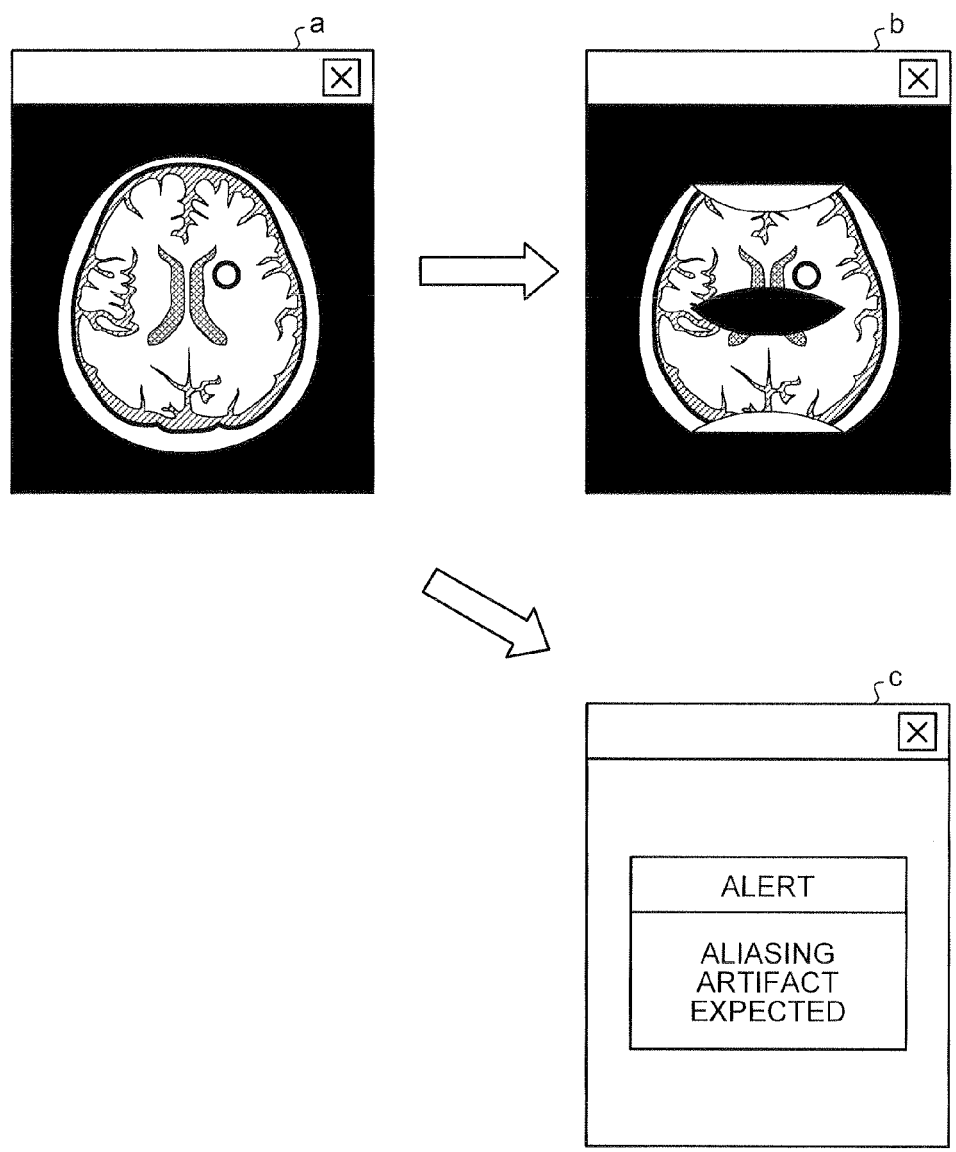
FIG. 15 is a diagram for explaining an aliasing artifact alert according to the third embodiment.

Thus, for example, it is assumed that the MRI apparatus 100 receives an instruction for changing the FOV designation from "50×50" to "20×20" from the operator. Then, the image reconstruction correcting unit 13e reads out the positioning image data by referring to the positioning image data storage unit 14c, corrects or reconstructs the image in accordance with the "20×20" FOV designation, and displays it on the display unit 15. For example, the image reconstruction correcting unit 13e displays an axial image indicated with letter b in place of an axial image indicated with letter a, as illustrated in FIG. 15. In the axial image b, an aliasing artifact occurs. Alternatively, if it is judged when reconstructing the NMR signal data and analyzing the actual area of the subject that the area does not fit in the designated FOV, the image reconstruction correcting unit 13e may display alert information such as "aliasing artifact expected" as indicated with letter c. FIG. 15 is a diagram for explaining the alert message about aliasing artifacts according to the third embodiment.

In the explanation of the third embodiment, techniques of displaying a changed image when FOV designation change is received, and of displaying the image or an alert message when an aliasing artifact occurs due to the change of the FOV designation have been discussed. These techniques are not always predicated on the techniques explained in the first and second embodiments. In other words, the techniques according to the third embodiment may be carried out independently of the technique of correcting or reconstructing the image in accordance with the channel selection change.

For example, the data collecting unit 12 collects the NMR signal data and enters it into the storage unit 14 at the imaging time of the positioning image. In addition, the image reconstruction correcting unit 13e reconstructs the image (the positioning image, a pattern image that schematically shows an image that would be obtained as a result of the main scanning, or the like) from the NMR signal data stored in the storage unit 14. The display unit 15 displays the reconstructed image (e.g., the image a in FIG. 14 and the image a in FIG. 15). The scan control unit 13a receives the FOV designation change, and notifies the image reconstruction correcting unit 13e of the change. Then, the image reconstruction correcting unit 13e corrects or reconstructs the image displayed on the display unit 15 by use of the NMR signal data stored in the storage unit 14 in accordance with the changed FOV, and the display unit 15 displays the corrected or reconstructed image (e.g., the images b and c of FIG. 14 and the image b of FIG. 15) and information notifying of changes that appear in the corrected or reconstructed image (e.g., information in the image c of FIG. 15).

The fourth embodiment is now explained. According to the fourth embodiment, it is assumed that the target image is a "stitching image".

If a large area covering multiple portions of the subject is to be imaged, the imaging of the MRI apparatus adopts a technique of taking partially overlapping images by moving the top board on which the subject lies, and combining the taken images into a composite image. The process of combining multiple images into one image is called "stitching process", and a composite image obtained through the stitching process is called "stitching image".

Figure 16:
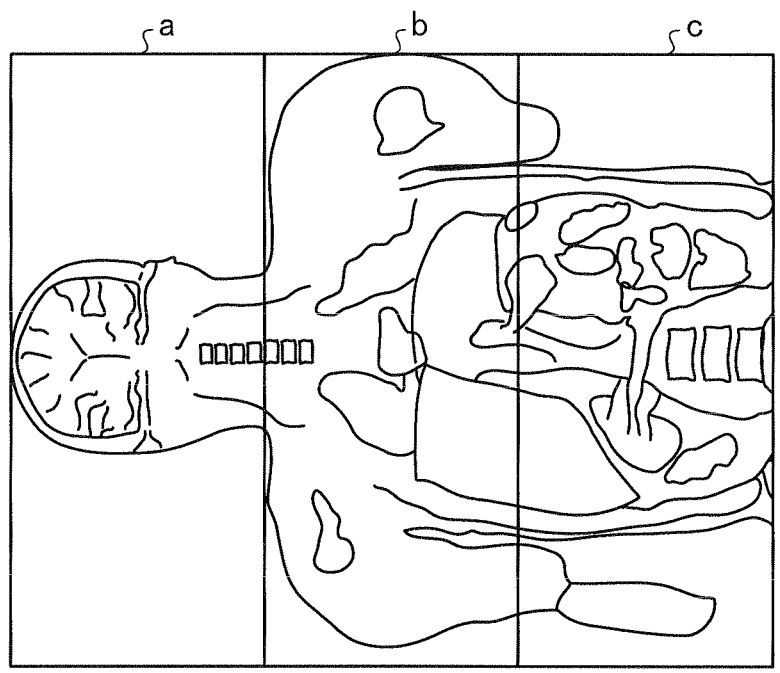
FIG. 16 is a diagram for explaining a stitching image according to the fourth embodiment.

FIG. 16 is a diagram for explaining a stitching image according to the fourth embodiment. For example, the MRI apparatus 100 according to the fourth embodiment collects the stitching image illustrated in FIG. 16, as a result of the main scanning. In the following explanation, a single imaging operation performed by moving the top board is referred to as a "stage". The stitching image illustrated in FIG. 16 is obtained by attaching three images (images a, b, and c) together that are collected through imaging at three stages.

The above MRI apparatus 100 according to the first embodiment corrects the positioning image data by use of the sensitivity map data and outputs it to the display unit 15 so that the decision making information as to how the image would be changed after the channel selection is changed can be offered to the operator. Similarly, the MRI apparatus 100 according to the fourth embodiment outputs the corrected positioning image data to the display unit 15 and offers decision making information to the operator. However, according to the fourth embodiment, the target image of the MRI apparatus 100 being a stitching image should be taken into consideration.

Figure 17:
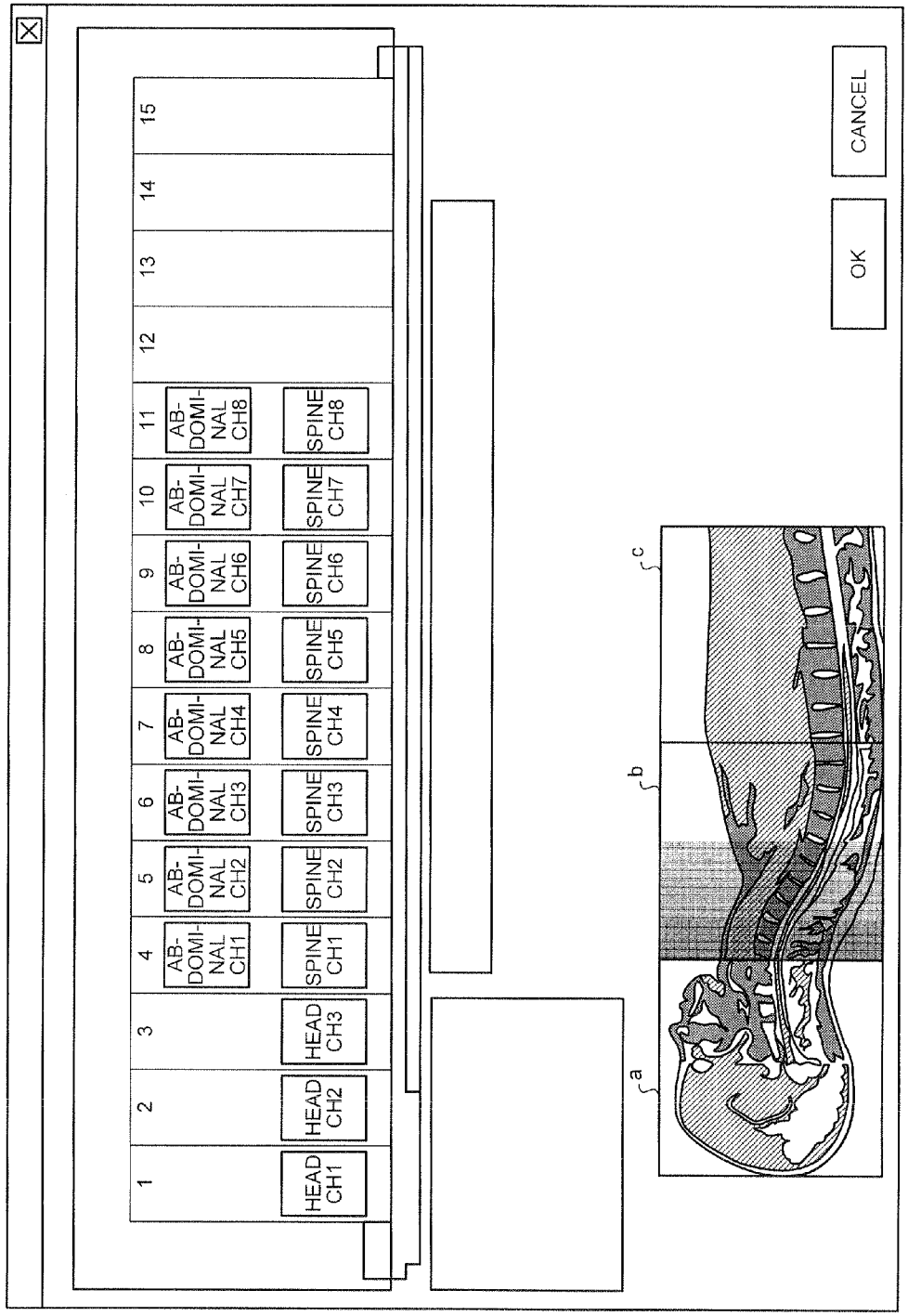
FIG. 17 is a diagram for explaining a channel selection screen according to the fourth embodiment.

FIG. 17 is a diagram for explaining a channel selection screen according to the fourth embodiment. As illustrated in FIG. 17, the display unit 15 according to the fourth embodiment displays, as a positioning image, a stitching image that is subjected to the stitching process. In FIG. 16, a coronal image serving as a target image is illustrated, and the positioning image corresponding to this image is the sagittal image illustrated in FIG. 17.

When the target image is a stitching image, the operator may request collection of the stitching images that have boundary regions in which the brightness seamlessly changes. Even if positioning images of different stages are individually displayed, it is difficult for the operator to determine whether the brightness varies seamlessly in the boundary regions of the stitching image. In contrast, if a stitching image subjected to the stitching process is displayed as a positioning image, the operator can easily determine whether the brightness seamlessly varies in the boundary regions of the stitching image.

For example, when looking at the positioning image displayed on the screen that is illustrated in FIG. 17, the operator may consider that the brightness does not vary seamlessly in the boundary region between the images a and b, with the brightness on the side of the image a higher than on the side of the image b, and thus that the stitching image looks unnatural. It can be predicted that such unnaturalness would appear in the coronal image collected through the main scanning. For this reason, the operator changes the channel selection so that the brightness would vary seamlessly in the boundary regions of, at least, the stitching image, which serves as a positioning image.

In the example of FIG. 17, a stitching image is displayed on the same screen as the channel selection screen. By providing the operator with the relationship between the relative positions of the subject and the channels, the operation of the channel selection change can be further facilitated. The technique of displaying the channel selection screen and the positioning image on the same screen may be equally applied to the first and second embodiments.

Figure 18:
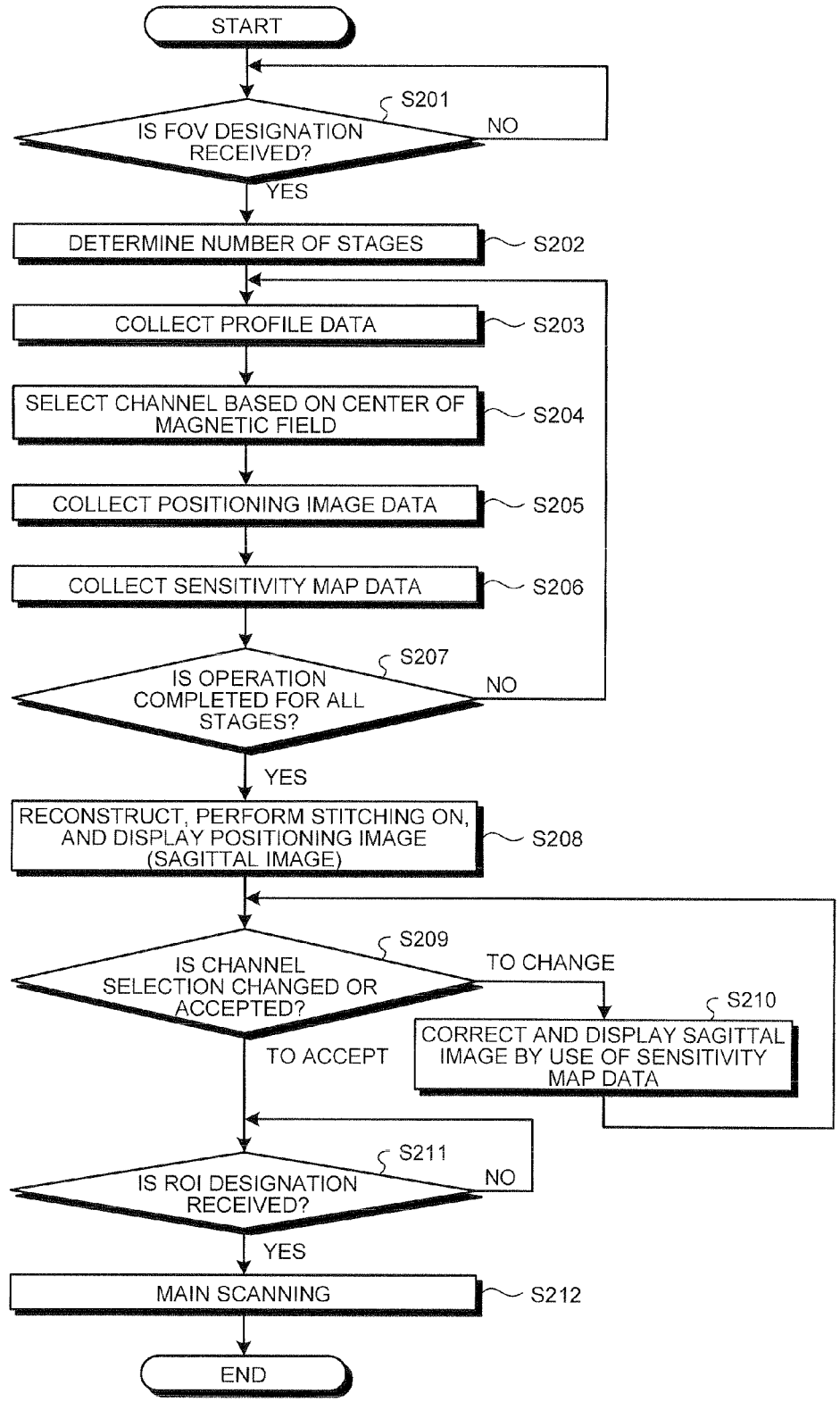
FIG. 18 is a flowchart of the processing procedure of the MRI apparatus according to the fourth embodiment.

Next, the process procedure of the MRI apparatus according to the fourth embodiment is explained with reference to FIG. 18. FIG. 18 is a flowchart of the process procedure of the MRI apparatus according to the fourth embodiment.

As indicated in FIG. 18, first, the scan control unit 13a receives FOV designation as one of the imaging conditions (step S201). It is, however, not limited to the FOV designation, but multiple areas of interest may be designated by manipulation of the mouse, or several names such as the fifth cervical vertebra may be designated.

Next, the scan control unit 13a determines the number of stages (step S202). For example, the scan control unit 13a determines that three stages are required, based on the fact that the FOV designated at step S201 is a large area.

Then, the operations of steps S203 to S206 are performed for each stage.

First, the profile data is collected under control of the scan control unit 13a (step S203). In particular, the image reconstruction correcting unit 13e generates the profile data, and the generated profile data is stored in the profile data storage unit 14b.

Next, the automatic channel selecting unit 13b selects a channel based on the center of magnetic field (step S204). More specifically, the automatic channel selecting unit 13b selects, for example, a channel with the highest sensitivity of the profile data in the center of magnetic field by referring to the profile data storage unit 14b.

Then, the positioning image data is collected under control of the scan control unit 13a (step S205), and then the sensitivity map data is collected (step S206).

Here, the scan control unit 13a determines whether the process is completed for all the stages that are determined at step S202 (step S207), and when it is determined that the process is incomplete (no at step S207), the system returns to the operation at step S203.

On the other hand, when the process is completed for the three stages and the scan control unit 13a determines that the process is completed for all the stages (yes at step S207), the image reconstruction correcting unit 13e reconstitutes the positioning image data, and displays it on the display unit 15 (step S208).

Here, the image reconstruction correcting unit 13e reconstructs three positioning images from the positioning image data collected for each stage by referring to the positioning image data storage unit 14c, and performs the stitching process onto the reconstructed positioning images to generate a stitching image. Then, the image reconstruction correcting unit 13e displays the stitching image on the display unit 15 (step S208). For example, as indicated in FIG. 17, a sagittal image subjected to the stitching process is displayed.

Next, the MRI apparatus 100 waits for reception of channel selection change or channel acceptance at the channel selection change receiving unit 13c and determines which one is received (step S209).

When the channel selection change receiving unit 13c receives the channel selection change, the image reconstruction correcting unit 13e corrects the sagittal image by use of the sensitivity map data that corresponds to the changed channel and displays it on the display unit 15 (step S210).

In other words, when receiving the channel identification information from the channel selection change receiving unit 13c, the image reconstruction correcting unit 13e reads out the sensitivity map data of the channel identified by the identification information, by referring to the sensitivity map data storage unit 14d. In addition, the image reconstruction correcting unit 13e reads the positioning image data from the positioning image data storage unit 14c, corrects the brightness of the read-out positioning image data by use of the read-out sensitivity map data, and displays it on the display unit 15.

Here, the image reconstruction correcting unit 13e performs the above correcting process individually onto the positioning images that are not yet subjected to the stitching process. Thereafter, it performs the stitching process again by use of the corrected positioning images, and displays the new stitching image on the display unit 15.

Then, the MRI apparatus 100 again waits for reception of channel selection change or channel acceptance (step S209), and when channel acceptance is received, the system proceeds to the ROI designation performed by the ROI designation receiving unit 13d (step S211).

When the ROI designation receiving unit 13d receives the ROI designation (yes at step S211), the system proceeds to the main scanning performed by the scan control unit 13a (step S212). The image reconstruction correcting unit 13e reconstructs the image data from the NMR signal data collected through the main scanning, and displays it on the display unit 15. The process procedure may be suitably modified in the same manner as in the first and second embodiments.

In the example of FIG. 17, the technique of displaying the stitching image subjected to the stitching process as a positioning image has been explained. The stitching image may not always have to be displayed, however. For example, the technique of placing and displaying individual positioning images in line may be adopted, as illustrated in FIG. 19. FIG. 19 is a diagram for explaining the channel selection screen according to the fourth embodiment.

As indicated in FIG. 19, the operator can determine to some extent whether the brightness varies seamlessly in the boundary areas of the stitching image. For example, when looking at the positioning images displayed on the screen of FIG. 19, the operator may compare, for example, the brightness of the image a on the b side with the brightness of the image b on the a side to find that the former is higher than the latter and that the brightness does not seamlessly vary, and may predict that the stitching image would become unnatural. The operator would also predict that such unnaturalness would appear equally in a coronal image collected through the main scanning. For this reason, the operator compares the positioning images and changes the channel selection to make the brightness in the boundary region vary seamlessly.

According to the fourth embodiment, the situation of the target image being a stitching image has been explained, with an example technique of correcting the positioning image data by use of the sensitivity map data. The embodiment is not limited thereto, however. The technique for the target image being a stitching image can be applied to the reconstruction of the positioning image at the time of changing the channel selection as in the second embodiment.

The embodiment may be realized in various embodiments other than the above embodiments.

For example, according to the first and second embodiments, when the channel selection change is received from the operator, the changed positioning image (a sagittal image and an axial image) is displayed on the display unit 15. However, the embodiment is not limited thereto. For example, the MRI apparatus 100 may display information to notify how the brightness of the changed sagittal image or axial image would be changed. If the ROI is designated on the sagittal image or the axial image before the channel selection is changed, the MRI apparatus 100 has recognized the position of the ROI on the sagittal image or the axial image. Thus, the MRI apparatus 100 may display alert information such as "brightness of ROI significantly lowered.

Furthermore, for example, when the MRI apparatus 100 receives channel selection change from the operator, the MRI apparatus 100 may estimate and calculate the reconstruction time length for the main scanning, and display the calculated reconstruction time length on the display unit 15. In addition, when, for example, the MRI apparatus 100 receives the speed rate change from the operator, the MRI apparatus 100 may generate a positioning image with a lowered sensitivity and display it on the display unit 15 if the speed rate is changed to a higher one. Furthermore, by inputting other imaging conditions, information generated and calculated after the change in accordance with the input conditions may be displayed on the display unit 15.

In addition, the usage of the function of automatically selecting a channel at the imaging time of the positioning image has been explained in the above embodiments, but the embodiment is not limited thereto. The embodiment can be applied to a situation in which the operator selects a channel at the imaging time of the positioning image.

For convenience of explanation, the sensitivity properties of the element coils are different from one another in the horizontal direction in the example of the first embodiment, but the embodiment is not limited thereto. For example, the sensitivity properties of the element coils may be different in the head circumferential direction, and the brightness of the positioning images may be corrected in accordance with the spatial distribution of the sensitivities of the element coils.

The MRI apparatus according to the present embodiments can assist the operator in selecting a channel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   an MRI gantry and associated MRI system components including static and gradient magnetic field magnets, a plurality of radio frequency (RF) coils, an RF transmitter and RF receiver configured to transmit and/or receive RF signals to and from an imaging volume within the gantry and a computing system connected to MRI gantry components for controlling same, said computing system being configured to
   collect magnetic resonance signal data received individually by a plurality of element coils for each channel assigned to each of the element coils at a positioning image taking time, and enter the magnetic resonance signal data that is collected for each channel in a storage unit;
   reconstruct an image from the magnetic resonance signal data stored in the storage unit by referring to the storage unit in relation to a channel selected at the positioning image taking time;
   display the reconstructed image;
   receive a channel selection change command;
   when the change command is received, correct the reconstructed image by use of the magnetic resonance signal data stored in the storage unit in relation to a channel that is changed; and
   display information regarding the corrected image.

2. The magnetic resonance imaging apparatus according to claim 1, wherein said computing system is further configured to receive an imaging field designation change and, in response, to correct the image by use of magnetic resonance signal data stored in the storage unit so that an imaging field after the change is adopted.

3. The magnetic resonance imaging apparatus according to claim 1, wherein the image that is corrected is displayed.

4. The magnetic resonance imaging apparatus according to claim 2, wherein the image that is corrected is displayed.

5. The magnetic resonance imaging apparatus according to claim 1, wherein the information to notify about change that appears in the image that is corrected is displayed.

6. The magnetic resonance imaging apparatus according to claim 2, wherein the information to notify about change that appears in the image that is corrected is displayed.

7. The magnetic resonance imaging apparatus according to claim 3, wherein the information to notify about change that appears in the image that is corrected is displayed.

8. The magnetic resonance imaging apparatus according to claim 4, wherein the information to notify about change that appears in the image that is corrected is displayed.

9. The magnetic resonance imaging apparatus according to claim 1, wherein said computing system is further configured to:
   generate a stitching image by executing a stitching process using a plurality of reconstructed images;
   the generated stitching image;
   generate a corrected stitching image by further executing the stitching process using the images that are corrected; and
   display the corrected stitching image as information regarding the corrected images.

10. A magnetic resonance imaging (MRI) apparatus, comprising:
    an MRI gantry and associated MRI system components including static and gradient magnetic field magnets, a plurality of radio frequency (RF) coils, an RF transmitter and RF receiver configured to transmit and/or receive RF signals to and from an imaging volume within the gantry and a computing system connected to MRI gantry components for controlling same, said computing system being configured to
    collect magnetic resonance signal data received individually by a plurality of element coils for each channel assigned to each of the element coils at a positioning image taking time, and enter the magnetic resonance signal data that is collected for each channel into a storage unit;
    reconstruct an image from the magnetic resonance signal data stored in the storage unit by referring to the storage unit in relation to a channel selected at the positioning image taking time;
    display the reconstructed image;
    receive a channel selection change command;
    when the change command is received, reconstruct an after-change image from the magnetic resonance signal data stored in the storage unit by referring to the storage unit in relation to a changed channel; and
    display information on the reconstructed after-change image.

11. The magnetic resonance imaging apparatus according to claim 10, wherein said computing system is further configured to:
    receive an imaging field designation change command and, in response, reconstruct the after-change image from the magnetic resonance signal data stored in the storage unit to adopt a changed imaging field.

12. The magnetic resonance imaging apparatus according to claim 10, wherein the reconstructed after-change image is displayed.

13. The magnetic resonance imaging apparatus according to claim 11, wherein the reconstructed after-change image is displayed.

14. The magnetic resonance imaging apparatus according to claim 10, wherein information to notify about change that appears in the reconstructed image is displayed.

15. The magnetic resonance imaging apparatus according to claim 11, wherein information to notify about change that appears in the reconstructed image is displayed.

16. The magnetic resonance imaging apparatus according to claim 12, wherein information to notify about change that appears in the reconstructed image is displayed.

17. The magnetic resonance imaging apparatus according to claim 13, wherein information to notify about change that appears in the reconstructed image is displayed.

18. The magnetic resonance imaging apparatus according to claim 10, wherein said computing system is further configured to:
generate a stitching image by executing a stitching process using a plurality of reconstructed images;
display the generated stitching image;
generate an after-channel-change stitching image by further executing the stitching process using images that are reconstructed after channel change; and
display the after-channel-change stitching image as information regarding the reconstructed image.

19. A magnetic resonance imaging apparatus, comprising:
an MRI gantry and associated MRI system components including static and gradient magnetic field magnets, a plurality of radio frequency (RF) coils, an RF transmitter and RF receiver configured to transmit and/or receive RF signals to and from an imaging volume within the gantry and a computing system connected to MRI gantry components for controlling same, said computing system being configured to
collect magnetic resonance signal data at a positioning image taking time, and enter the magnetic resonance signal data that is collected into a storage unit;
reconstruct an image from the magnetic resonance signal data stored in the storage unit by referring to the storage unit;
display the reconstructed image;
receive an imaging field designation change command;
when a change command is received by, correct the image by use of the magnetic resonance signal data stored in the storage unit to adopt a changed imaging field; and
display an after-change corrected image.

20. A magnetic resonance imaging apparatus, comprising:
an MRI gantry and associated MRI system components including static and gradient magnetic field magnets, a plurality of radio frequency (RF) coils, an RF transmitter and RF receiver configured to transmit and/or receive RF signals to and from an imaging volume within the gantry and a computing system connected to MRI gantry components for controlling same, said computing system being configured to
collect magnetic resonance signal data at a positioning image taking time, and enter the magnetic resonance signal data that is collected into a storage unit;
reconstruct an image from the magnetic resonance signal data stored in the storage unit;
display the reconstructed image reconstructed by the reconstructing unit;
receive an imaging field designation change command;
when a change command is received, correct the image by use of the magnetic resonance signal data stored in the storage unit to adopt a changed imaging field; and
display information to notify about change that appears in the corrected image.

\* \* \* \* \*